US 8,206,838 B2

(12) United States Patent
Marrocco, III et al.

(10) Patent No.: US 8,206,838 B2
(45) Date of Patent: Jun. 26, 2012

(54) POLYMER MATRIX ELECTROLUMINESCENT MATERIALS AND DEVICES

(75) Inventors: Matthew L. Marrocco, III, Fontana, CA (US); Farshad J. Motamedi, Claremont, CA (US); Feras Bashir Abdelrazzaq, Covina, CA (US); Bashir Twfiq Abdelrazzaq, legal representative, Aman (JO)

(73) Assignee: Sumitomo Chemical Co., Ltd., Tokyo (JP)

( * ) Notice: Subject to any disclaimer, the term of this patent is extended or adjusted under 35 U.S.C. 154(b) by 385 days.

(21) Appl. No.: 10/738,143

(22) Filed: Dec. 16, 2003

(65) Prior Publication Data
US 2005/0186443 A1 Aug. 25, 2005

Related U.S. Application Data

(63) Continuation-in-part of application No. 09/879,752, filed on Jun. 12, 2001, now abandoned.

(60) Provisional application No. 60/211,108, filed on Jun. 12, 2000.

(51) Int. Cl.
*C08G 79/00* (2006.01)
*H01L 29/08* (2006.01)
*C09K 11/02* (2006.01)
*H01J 29/32* (2006.01)

(52) U.S. Cl. ........ 428/690; 428/917; 313/504; 313/506; 257/40; 252/301.35; 528/9; 528/395

(58) Field of Classification Search .................. 313/504, 313/506; 257/40, E51.028, E51.036, E51.041, 257/E51.044; 252/301.16, 301.35, 301.36; 526/240, 241; 428/690, 917

See application file for complete search history.

(56) References Cited

U.S. PATENT DOCUMENTS

| 5,118,405 | A | * | 6/1992 | Kaneko et al. ................. 204/433 |
| 5,128,587 | A | | 7/1992 | Skotheim et al. |
| 5,227,457 | A | | 7/1993 | Marrocco, III et al. |
| 5,442,021 | A | * | 8/1995 | Heiliger ........................ 526/241 |
| 5,540,999 | A | | 7/1996 | Yamamoto et al. |
| 5,580,527 | A | * | 12/1996 | Bell et al. .................... 422/82.07 |
| 5,708,130 | A | | 1/1998 | Woo et al. |
| 5,728,801 | A | | 3/1998 | Wu et al. |
| 5,756,224 | A | | 5/1998 | Boerner et al. ................ 428/690 |
| 5,777,070 | A | | 7/1998 | Inbasekaran et al. |
| 5,821,002 | A | | 10/1998 | Ohnishi et al. |
| 5,834,020 | A | * | 11/1998 | Margerum et al. ........... 424/484 |

(Continued)

FOREIGN PATENT DOCUMENTS

EP 0 697 744 A1 2/1996

(Continued)

OTHER PUBLICATIONS

Zhao et al., Organic Light-Emitting Diode Using Eu+3 Polymer Complex as an Emitter, Japanese Journal of Applied Physics, Part 2, No. 1A/B, Jan. 15, 1999, pp. L46-L48.*

(Continued)

*Primary Examiner* — Jennifer Chriss
(74) *Attorney, Agent, or Firm* — Pillsbury Winthrop Shaw Pittman LLP

(57) ABSTRACT

Photoluminescent and electroluminescent compositions are provided which comprise a matrix comprising aromatic repeat units covalently coordinated to a phosphorescent or luminescent metal ion or metal ion complexes. Methods for producing such compositions, and the electroluminescent devices formed therefrom, are also disclosed.

128 Claims, 8 Drawing Sheets

U.S. PATENT DOCUMENTS

| | | | |
|---|---|---|---|
| 5,834,894 | A | 11/1998 | Shirasaki et al. |
| 5,962,631 | A | 10/1999 | Woo et al. |
| 5,989,738 | A | 11/1999 | Haase et al. |
| 6,169,163 | B1 | 1/2001 | Woo et al. |
| 6,392,250 | B1 | 5/2002 | Aziz et al. |
| 6,559,277 | B2* | 5/2003 | Rietz et al. ............... 528/397 |
| 6,696,180 | B2* | 2/2004 | Doi et al. ............... 428/690 |
| 6,869,693 | B2* | 3/2005 | Fryd et al. ............... 428/690 |
| 2002/0110701 | A1 | 8/2002 | Wehrmann et al. |
| 2002/0193532 | A1* | 12/2002 | Ikehira et al. ............ 525/333.3 |
| 2003/0091862 | A1* | 5/2003 | Tokito et al. .............. 428/690 |
| 2003/0148142 | A1* | 8/2003 | Fryd et al. ............... 428/690 |
| 2003/0186080 | A1 | 10/2003 | Kamatani et al. |
| 2004/0131886 | A1* | 7/2004 | Marrocco et al. ........... 428/690 |

FOREIGN PATENT DOCUMENTS

| | | |
|---|---|---|
| EP | 0949695 A2 | 10/1999 |
| EP | 0 697 744 B1 | 1/2000 |
| EP | 1245659 | 10/2002 |
| JP | 10-204426 | 4/1998 |
| WO | WO 92/03490 | 3/1992 |
| WO | WO 94/15441 | 7/1994 |
| WO | WO 00/55927 | 9/2000 |
| WO | 02/31896 | 4/2002 |
| WO | WO 03/001616 A2 | 1/2003 |
| WO | WO 03/091355 A2 | 11/2003 |

OTHER PUBLICATIONS

Adachi, et al., "High-efficiency Red Electrophosphorescence Devices," *Applied Physics Letters*, Mar. 12, 2001, pp. 1622-1624, vol. 78, No. 11.

Blasse, et al., "Luminescent Materials," 1994, Chapter 5, 5 pages, Springer-Verlag.

Cazeca, et al., "Enhanced Performance of Polythiophene Derivative Based Light Emitting Diodes by Addition of Europium and Ruthenium Complexes," *Synthetic Metals*, 1998, pp. 45-49, vol. 98.

Kraft, et al., "Electroluminescent Conjugated Polymers-Seeing Polymers in a New Light," *Agnew. Chem Int. Ed,.* 1998, pp. 403-428, vol. 37.

McGehee, et al., "Narrow Bandwidth Luminescence from Blends with Energy Transfer from Semiconducting Conjugated Polymers to Europium Complexes," *Advanced Materials*, 1999, pp. 1349-1354, vol. 11, No. 16.

PCT International Search Report dated Sep. 18, 2001 from corresponding PCT application No. PCT/US2001/018867 filed Jun. 12, 2001, Search Report mailed Oct. 30, 2001 (3 pgs.).

Salbeck, et al., "Spiro Linked Compounds as Active Materials in Organic Light Emitting Diodes," Polymer Preprints, Apr. 1997, pp. 349-350, vol. 38, No. 1.

Supplementary Partial European Search Report dated Nov. 16, 2004 for European Patent Application No. 01 948 324.7 and mailed Dec. 3, 2004 (3 pages).

Yang, et al., "Efficient Blue Polymer Light-Emitting Diodes from a Series of Soluble Poly (paraphenylene)s)," *J. Appl. Phys.*, Jan. 15, 1996, pp. 934-939, vol. 79(2).

Zhang, et al., "Voltage-dependent Recombination Region Movement in Organic Light-emitting Diodes (OLEDs) Based on a Europium Complex-doped Polymer," *Journal of Luminescence 87-89*, 2000, pp. 1149-1151.

Beljonne, D. et al., Spatial extent of the singlet and triplet excitons in transition metal-containing poly-ynes, *J. Chem. Phys.* (Sep. 1, 1996) vol. 105 (9), pp. 3868-3877.

Bernius, M. et al., Developmental Progress of Electroluminescent Polymeric Materials and Devices, in, SPIE Conference on Organic Light-Emitting Materials and Devices III, Denver, Colorado Jul. 19-21, 1999, SPIE vol. 37976, pp. 129-137.

Cazeca, M. et al., Enhanced performance of polythiophene derivative based light emitting diodes by addition of europium and ruthenium complexes, *Synthetic Metals* (1998) vol. 98, pp. 45-49.

Chawdhury, N. et al., Synthesis and Electronic Structure of Platinum-Containing Poly-ynes with Aromatic and Heteroaromatic Rings, *Macromolecules* (1998) vol. 31(3), pp. 722-727.

Epstein, A.J. et al., Poly (p-pyridine)—and poly (p-pyridyl vinylene)-based polymers: their photophysics and application to SCALE devices, *Synthetic Metals* (1996) vol. 78, pp. 253-261.

Kim, J. et al., Novel Layer-by-layer Complexation Technique and Properties of the Fabricated Films, *Chem Matter* (1999) vol. 11, pp. 2250-2256.

Kim, J. et al., Preparation and Properties of Luminescent Metal-Complex Containing Conjugated and Non-Conjugated Polymers, *Polymer Preprints* (American Chemical Society, Division of Polymer Chemistry) (1999) vol. 40(2), pp. 1237-1238.

Kohler, A. et al., Donor-acceptor interactions in organometallic and organic poly-ynes, *Synthetic Metals* (1999) vol. 101, pp. 246-247.

Kraft, A. et al., Electroluminescent Conjugated Polymers—Seeing Polymers in a New Light, *Angew. Chem. Int. Ed.* (1998) vol. 37, pp. 403-428.

McGehee, M. D. et al., Narrow Bandwidth Luminescence from Blends with Energy Transfer from Semiconducting Conjugated Polymers to Europium Complexes**, *Advanced Materials* (1999) vol. 11(16), pp. 1349-1354.

Wittmann, H.F. et al., Optical spectroscopy of platinum and palladium containing poly-ynes, *J. Chem. Phys.* (Aug. 1994) vol. 101(4), pp. 2693-2698.

Yu, W-L. et al., Spiro-Functionalized Polyfluorene Derivatives as Blue Light-Emitting Materials, Emitting Materials, *Advanced Materials* (2000) vol. 12(11), pp. 828-831.

Opposition to EP 1 297 060 B1 dated Jul. 2, 2008, filed in the European Patent Office Jul. 3, 2008 (21 pages).

EP Application No. 04818037.6, Supplementary European Search Report dated Apr. 27, 2011.

Ley, K.D., Schanze, K.S., "Photophysics of metal-organic π-conjugated polymers", *Coordination Chemistry Reviews* 171 (1998) 287-307.

* cited by examiner

Device run @ 7V-16V

POLYMER MATRIX ELECTROLUMINESCENT MATERIALS AND DEVICES

CROSS-REFERENCE TO RELATED APPLICATIONS

The present application is a continuation-in-part of U.S. application Ser. No. 09/879,752, filed Jun. 12, 2001 now abandoned, which claims priority to U.S. provisional patent application No. 60/211,108, filed Jun. 12, 2000, the disclosures of which are expressly incorporated herein by reference.

STATEMENT OF FEDERAL FUNDING

The U.S. federal government may have rights to the disclosed invention based on funding provided under a Department of Energy grant (DOE Grant No. DE-FG02-03ER83850).

FIELD OF THE INVENTION

This invention relates to photoluminescent and electroluminescent compositions comprising a matrix comprising aromatic repeat units and a luminescent metal ion or a luminescent metal ion complex. The invention also relates to method for making such compositions and electroluminescent devices using such compositions.

BACKGROUND OF THE INVENTION

Many types of luminescent devices exist, including a number of all solid state devices. Solid state devices are preferable over incandescent or fluorescent bulbs in that they are lighter; more compact, can be made smaller, and can have higher efficiency. Examples of solid state luminescent devices are light emitting diodes (LEDs), such as gallium arsenide or silicon carbide LEDs, organic light emitting diodes (OLEDs), and polymeric devices typically referred to as polymer light emitting diodes (PLEDs).

Of the various luminescent devices and displays the OLED/PLEDs are the newest and least mature technology. These devices typically consist of a thin film structure comprising a transparent electrode, usually indium doped tin oxide (ITO) on a glass or plastic support layer, the ITO optionally coated with polyaniline or poly(ethylenedioxythiophene) (PEDOT), one or more organic containing layers, typically a hole conducting layer, for example, of a triphenylamine derivative, a luminescent layer, for example, a polyphenylenevinylene derivative or a polyfluorene derivative, an electron conducting layer, for example, an oxadiazole derivative, and a second electrode, for example, calcium, magnesium, aluminum, and the like.

The advantages of the OLED and PLED devices are, lightweight, potentially low cost (although this has yet to be demonstrated commercially), the ability to fabricate thin film, flexible structures, wide viewing angle, and high brightness. The disadvantages of these devices are the short device lifetimes, increasing voltages when operated in a constant current mode, and broad spectral widths. In addition, the efficiency of OLEDs and PLEDs is limited by the nature of the excited state of organic molecules. Typically, both the singlet and triplet excited states are populated during the operation of an OLED/PLED. Unfortunately, in electroluminescence only decay from the singlet state produces useful light. Decay from the triplet state to a singlet ground state is spin forbidden and therefore slow, giving non-radiative processes more time to take place. Because the triplet state is three-fold degenerate and the singlet state is not degenerate; three quarters of the excited electrons enter the triplet state and produce little or no light. (See, A. Kohler, J. S. Wilson, and R. H. Friend, *Av. Mater.*, 2002, 14(10), 701-707.) To address this problem, some groups have attempted to use doped phosphorescent compounds that can utilize both singlet and triplet energies for emission. Exemplary disclosures include, Thompson, et al. U.S. Pat. No. 6,303,238; Thompson, et al. *J. Amer. Chem. Soc.*, 2001, 123, 4304; Lamansky, et al., *J. Appl. Phys.*, 2002, 92(3), 1570; Kim, et al., *Appl. Phys. Lett.*, 2000, 77(15), 2280; and Cao, et al., *Appl. Phys. Lett.*, 2002, 80(12), 2045, the disclosures of which are incorporated herein by reference. Hopwever, all these devices suffer from lower efficiencies compared to small molecule phosphorescent devices, also the long-term stability of these polymeric devices was not reported. It appears that potential phase separation and aggregation hamper the long-term operation of such devices.

An additional disadvantage of OLEDs and PLEDs is the relatively short lifetime of the excited state of organic molecules. In a display application each pixel is scanned 10 to 100 times every second, typically 60 times every second. It is desirable for the light from the pixel to decay on about the same time scale. If the pixel decays too slowly each subsequent image will be scanned over the not yet faded previous image, and the image will blur. If the pixel decays too quickly, there will be a noticeable flicker.

Another inherent problem associated with current OLED/PLED displays arises when one attempts to create white light emitters. LED white light emitters are created by mixing red, green, and blue emitting compounds together, however, because the higher energy blue and green emitters bleed energy into the red emitters when in close proximity, the white light emitters created by simple mixing, have a tendency to produce light with a red tinge. To prevent this "energy bleed" manufacturers have had to physically separate the different colored emitters, such as by creating nanostructure channels. Unfortunately, this additional processing dramatic increases the cost of these white light emitters making them less cost-effective.

As should be understood from the above discussion, there are a number of limitations inherent in conventional OLED/PLED displays that prevent widespread adoption of these devices. Accordingly, there is a need for an improved electroluminescent device that is not limited by the short lifetimes; that has stable I-V characteristics making the associated electronics simpler; that has higher efficiency, not limited by decay from non-luminescent triplet states; that has phosphorescent decay times in the appropriate range for scanned displays and passive displays; that have pure color characteristics that are more amenable to color displays; and/or that have stable white light characteristics.

SUMMARY OF THE INVENTION

The present invention is directed to an improved PLED comprising a phosphorescent polymer composition comprising conjugated, partially conjugated, or non-conjugated repeat units covalently coordinated to phosphorescent metal ions such that both the singlet and triplet excited states may be accessed during emission.

In one embodiment, the polymer comprises repeat units selected from the group consisting of:

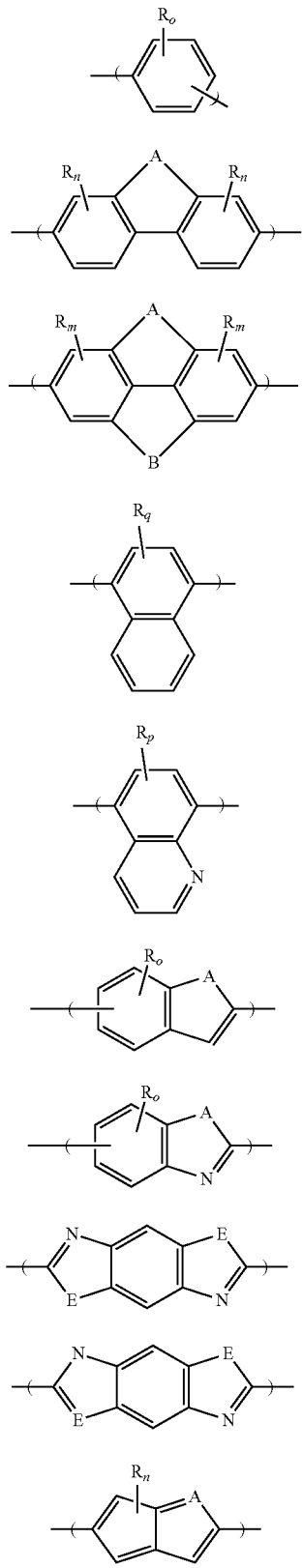

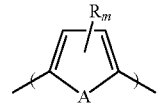

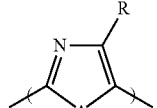

where R is independently H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; m is 0-2; n is 0-3; o is 0-4; p is 0-5; q is 0-6; r is 0-7; A and B are independently selected from the group consisting of —O—, —S—, —$NR_8$—, and —$CR_1R_2$—, —$CR_1R_2CR_3R_4$—, —N=$CR_1$—, —$CR_1$=$CR_2$—, —N=N—, and —(CO)—, where $R_8$ is H, D, alkyl, aryl, heteroaryl, fluoroalkyl, fluoroaryl, ketone, arylketone, arylester, alkylester, and carboxylic acid; where $R_1$-$R_4$ are H, D, F, Cl, Br, I, alkyl, aryl, alkyleneoxy, polyalkyleneoxy, alkoxy, aryloxy, fluoroalkyl, and fluoroaryl; E is selected from the group consisting of O, NH, and S, and one or more luminescent metal ions; and where any two adjacent R groups taken together may be bridging.

In another embodiment, the polymer composition further comprises at least one cyclometalating unit selected from the group consisting of:

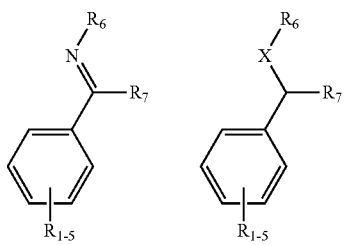

where X is O, S, NH, or $NR_8$, where $R_6$ and $R_8$ are H, D, alkyl, aryl, heteroaryl, fluoroalkyl, fluoroaryl, ketone, arylketone, arylester, alkylester, and carboxylic acid; where $R_1$-$R_5$ and $R_7$ are H, D, F, Cl, Br, I, alkyl, aryl, alkyleneoxy, polyalkyleneoxy, alkoxy, aryloxy, fluoroalkyl, and fluoroaryl; and where any two adjacent R groups taken together may be bridging.

In still another embodiment, the metal ion or metal ion complexes are selected from the group VIII metals, including, but not limited to platinum, iridium, and gold.

In yet another embodiment, the polymer is a dendritic or hyper-branched polymer.

In still yet another embodiment, the invention is directed to a method of forming phosphorescent polymer compounds as described above.

In still yet another embodiment, the invention is directed to an electroluminescent device comprising the phosphorescent composition set forth above. In one embodiment, the electroluminescent device comprises a first electrode, one or more charge transport layers, an electroluminescent layer comprising the composition set forth above and a second electrode.

In still yet another embodiment, two or more polymers that emit different wavelengths of light are combined with an additional polymer or polymers that serve as charge carriers.

For example, the composition may consist of a conjugated or partially conjugated charge carrying polymer that has both good hole transport and good electron transport properties, blended with red, blue and green emissive non-conjugated hyperbranched polymers. In another embodiment the matrix is a conjugated or partially conjugated polymer and the emissive polymers are dendrimers.

In still yet another embodiment the emissive polymers are mixed with a hole transport polymer and a separate electron transport polymer. In such an embodiment, the emissive polymers and matrix polymers may be any combination of linear, branched, hyperbranched, and dendrimeric.

In still yet another embodiment the composition of the emissive layer includes a small molecule as well as polymeric emissive materials.

BRIEF DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE INVENTION

Figure 1:
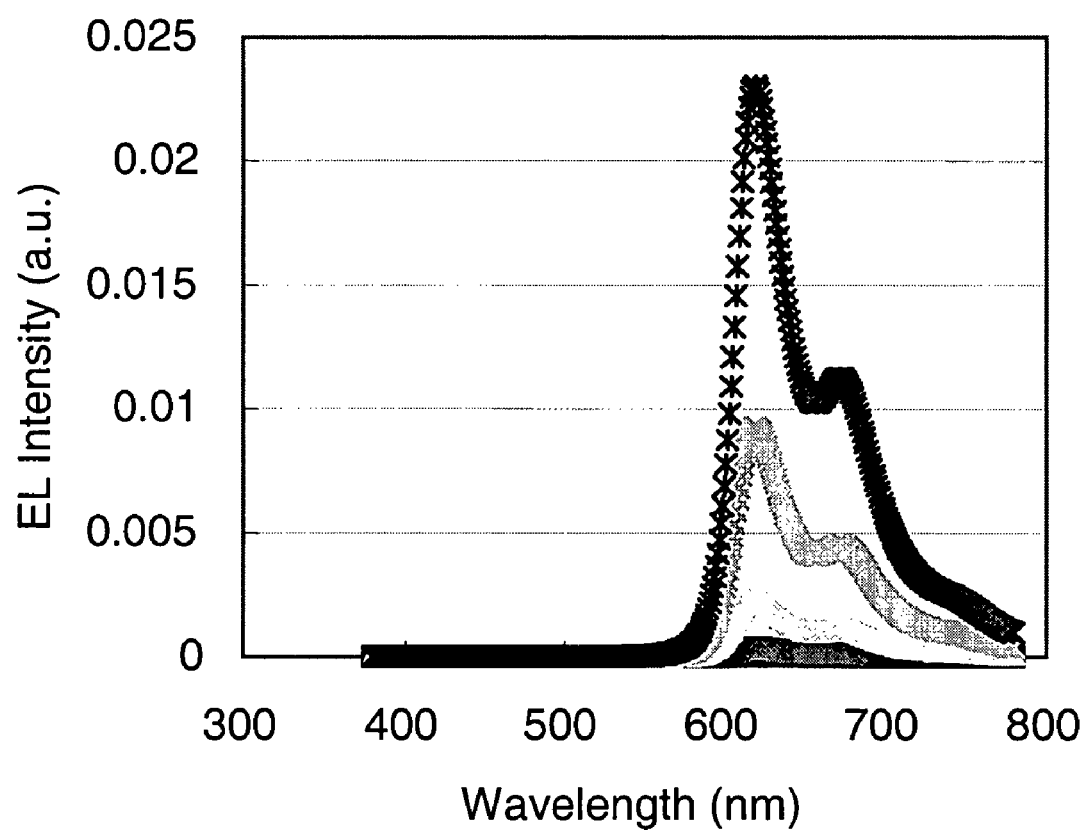
FIG. 1 is a spectrum of the electroluminescent properties of the polymer described in Example 38.

The present invention is directed to electroluminescent compositions which generally comprise a polymeric matrix coordinated to phosphorescent metal ion or metal ion complex, methods for producing such compositions, and the electroluminescent devices formed therefrom.

In order to overcome the deficiencies of previous electroluminescent devices it would be desirable to have a device with higher efficiency and with longer lifetime. It would also be desirable to have a device that operated at low voltage, preferably less than 20 volts, more preferably less than 15 volts, even more preferably less than 10 volts, and most preferably less than 5 volts DC. It would also be desirable to have a device with good color quality, and appropriate phosphorescent decay time for displays.

It has been surprisingly found that many of the disadvantages of the different prior art electroluminescent devices may be overcome by the use of a phosphorescent metal ion or metal ion complex coordinated to a polymer chain in an OLED device. This combination provides high efficiency electroluminescence together with low turn-on voltage, facile and cost-effective fabrication and stable operational properties. For example a phosphorescent polymeric compound may comprise iridium bis(phenylpyridine) coordinated to a polymer comprising acetylacetonate polarizable units.

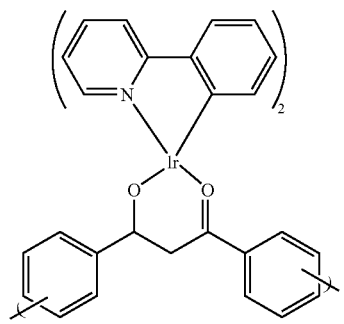

Current PLED devices are based on conjugated polymers (e.g., polyarylenes, polythiophenes, polyphenylenevinylenes, polyfluorenes, etc.), which utilize fluorescence emission. Fluorescence relies on antisymmetric (singlet) excitons for emission. In electroluminescence (EL), the fraction of excitons formed upon charge recombination is believed to be about 25-50% for singlet, with the remaining 50-75% of the energy going to triplet exciton formation that cannot be utilized for emission in fluorescent emitters. This limits the maximum efficiency of current PLED devices to about 25-50%.

Phosphorescent-based devices, however, do not suffer from this same efficiency limitation. Various examples of phosphorescent dye doping into various matrices, including polymeric matrices, have been demonstrated. One of the first reported examples of almost 100% internal quantum efficiencies in a small molecule based phosphorescent OLED was reported by Baldo et al *Nature,* 2000, 403, 750. However, the polymer based phosphorescent OLEDs are significantly less efficient than the small molecule phosphorescent OLEDs. Also long-term stability of polymer based OLEDs was not reported. It is reasonable to believe that potential phase separation and aggregation could hamper long-time operation, potentially limiting their use in PLED.

The term phosphorescent in this invention refers to materials that emit light from states other than pure singlet states. Thus phosphorescence includes emission from pure organic triplet states, mixed states that have some triplet character, where for example, mixing can be induced by a nearby or coordinated metal ion, charge transfer states with triplet character, including triplet metal to ligand charge transfer states ($^3$MLCT), states of higher multiplicity, for example, emission from the $^5D_0$ excited state of europium ions, and the like. As used herein the term triplet state includes all states with some triplet character. Emission primarily from a triplet state means that at least 25% of the emitted light is from other than a pure singlet state, preferably at least 50%, more preferably at least 75%, even more preferably at least 85%, and most preferably at least 95% from other than a pure singlet state.

Phosphorescence is often described as having a longer lifetime than fluorescence and distinguished by this characteristic, however, because heavy atoms (e.g. Ir, Pt) induce intersystem crossing the phosphorescent lifetime of materials comprising heavy atoms can be relatively short. Phosphorescence as used herein is not limited by excited state lifetimes.

In the practice of the present invention, a phosphorescent metal ion or complex, preferably group VIII or gold metal ion or complex, is embedded within a charge transporting polymeric matrix, wherein upon electrical excitation emission from the metal ion or complex occurs. The polymer provides the metal with coordination sites. For the purpose of this invention, coordination is taken to mean any or all of chelation, ligation, cyclometalation, or the like where the coordination between the polymer and the metal ion or complex occurs, covalently or otherwise, through a bond between the metal and an atom or atoms on the polymer, preferably O, S, N, C, and P.

The metals of the present invention are typically multivalent and therefore prefer to coordinate to more than a single site. In one embodiment of the present invention, more than one chain can coordinate with a single metal ion or complex. In this case one or more counter ligands or counter ions may also be present. The counterions may or may not coordinate to the metal. However it would be preferred that only one polymer chain coordinate with the metal ion and that other coordination sites on the metal be occupied by ligands or counterions known in the art.

The present invention allows the coordination of the metal complex to the polymer to occur through different processes including but not limited to cyclometalation and chelation. The coordination site of the polymer chain is covalently connected to the polymer chain and can be present on the main chain, the side chain or the termini of the chain. It can also be conjugated or not conjugated to the backbone of the polymer.

The luminescent metal ion may be any metal ion or complex that phosphoresces including but not limited to group VII transition metals including platinum, iridium and gold.

The polymeric phosphors of the present invention will have much greater emissive efficiencies than previous PLED materials because they will utilize all of the excited state energies of the emissive material and be capable of emitting from the triplet states. This differs fundamentally from previous PLED materials in that PLED materials of the present invention can harvest and emit the triplet state energies that are otherwise non-emissive in PLEDs.

The coordination of the emissive metal center to the charge transporting polymer chain enhances energy transfer from the polymer to the emissive metal center in the case of charge recombination at the polymer. This results in emission from the metal ion or complex, perhaps from a lower energy level, but in the visible spectrum and with much higher quantum efficiency. In addition, such coordination will improve dispersion of the metal ion or complex within the polymer matrix, decreasing the potential for detrimental processes such as stacking, excimer formation, concentration quenching, and triplet-triplet annihilation. These polymeric phosphors will also offer improved processability and decreased crystallinity relative to current state-of-the-art materials. PLEDs of the present invention will be fabricated using facile and cost-effective processes including coating, printing and the like known in the art.

The polymers of the present invention will facilitate tuning of the photophysical properties and the emission color through control of the relative amount of the metal ion or complex coordinated to the polymer, through electronic coupling of the metal ion or complex to the polymer backbone by conjugation, or by changing the chemical structure of the polymer backbone. The appropriate amount of the metal ion or complex present in the PLED material of the present invention is primarily determined by the amount necessary to achieve the desired spectral characteristics. These would be red, green and blue colors as defined according to the CIE scale, and infrared. The preferred wavelength of infrared emission is determined by that appropriate for telecommunication applications, typically around 1.3 micrometer and 1.5 micrometer.

Metal ions are much less subject to bleaching or chemical reactions that destroy the fluorophor than organic species. The term fluorophor is used here to mean the chemical system that absorbs energy and re-emits it, typically the emitted energy is light of lower energy than the absorbed energy. The chemical system may be an atom, an ion, a molecule, a metal complex, an oligomer, a polymer, or two or more atoms, ions, or molecules in close proximity, capable of exchanging energy. Fluorophors may be, but are not limited to being, photoluminescent, fluorescent, phosphorescent, cathodoluminescent, or electroluminescent. Although the devices of the instant invention are still partly organic, the metal ions or complexes exert a protective effect by removing energy from the organic excited state. The PLEDs of the present invention are thus expected to have longer lifetimes than previous PLEDs. The term luminescence in this invention refers to the emission of light from any or all of singlet, triplet, or excimeric excited states.

The luminescent metal ions or complexes may be present as part of an inorganic solid. For example, an inorganic powder, comprising a phosphorescent metal ion may be mixed with a polymer. The inorganic powder is preferably 400 mesh (average particle size less than about 38 microns), or finer, more preferably less than about 20 microns, even more preferably less than about 5 microns, and most preferably less than about 3 microns. The inorganic powder may be a nanosized powder with average physical dimensions in the 1 to 1000 nanometer range, preferably less than about 500 nanometers, and more preferably less than about 100 nanometers. Nanometer sized particles have very high surface to volume ratios and a high fraction of the metal ions or complexes are at the surface of the particle or within several angstroms (several tens of nanometers) of the surface, making energy transfer to the metal ion from a polymer in which the powder is embedded possible. Nanosized particles less than about 300 nm do not scatter visible light. In the practice of the present invention, the light emitting films may be less than 1000 nm and, if particles are to be used, the particles are preferably smaller than the film thickness. The inorganic solid may be a semiconductor. Non-limiting examples of semiconductors are gallium nitride, tin oxide, zinc oxide, zinc sulfide, cadmium sulfide, cadmium selenide, lead oxide, and the like. Semiconductors comprising elements of groups II and VI (II-VI semiconductors) can often be prepared by wet chemical methods and are therefore preferred. Inorganic particles comprising metal ions with organic ligands such as those described above may be prepared, for example, by sol-gel methods, or by imbibing or ion exchanging metal complexes into porous, microporous, or nanoporous inorganic solids or matrices.

Merely mixing a phosphorescent metal ion or complex with a charge transporting polymer does not produce high efficiency PLEDs. We have found that the efficiency of phosphorescent PLEDs can be increased to levels reported for small molecule phosphorescent OLEDs by providing a polymer having functional groups, either side groups, or main chain groups, or end groups, that bind or coordinate to the phosphorescent metal ion, or metal ion complex. Any functional group that coordinates to a metal may be used. It will be understood by one skilled in the art how to determine if a functional group is coordinated, for example, by observation of spectral shifts of the functional group in the IR, visible, or NMR spectra. Functional groups may be monodentate, or chelating multidentate, cyclometalating or macrocyclic. Functional groups that may be used include but are not limited to amines, amides, alcohols, alpha diketones, alpha ketoalcohols, beta diketones, beta ketoalcohols, beta ketoacids, bipyridines, biquinolines, borates, carboxylic acids, catecols, diols, hydroxyquinolines, phenanthrolines, phenols, phosphates, polyamines, polyethers, pyridines, phenylpyridines, quinolines, phenylquinolines, porphrines, thienylpyridines, oxazoles, benzoxazoles, phenyloxazoles, thiazoles, benzothiazoles, phenylthiazoles, salicylates, picolinates, sulfates, thioethers, thiols, thiophenes, and the like. Functional groups may lose one or more protons upon coordination to the phosphorescent metal ion.

The functional groups on the polymer may replace all or some of the ligands on the phosphorescent metal. That is, the metal may have additional ligands other than the polymer functional groups, including coordinated counter ions.

Coordination of the metal ion or complex to the polymer can occur through cyclometalation or interaction of the metal and polymer through a polarizable group attached covalently to the polymer. For the purposes of the present invention, a polarizable group will have at least one double bond; preferably, a carbon-carbon double bond. More preferably, the polarizable group will have two or more double bonds; even more preferably, three or more double bonds; yet more preferably, four or more double bonds; even yet more preferably, five or more double bonds; and most preferably, six or more double bonds. It is further preferable that some or all of the double bonds be conjugated with one another. The double bonds may be part of an aromatic or heteroaromatic ring, such as a benzene, pyridine, or quinoline ring. The aromatic ring may be terminal (eg., phenyl) or internal (e.g., phenylene). For the purposes of the present invention, conjugated ligands are polarizable ligands.

The polymers of the present invention can be conjugated, partially conjugated or non-conjugated. Non-limiting examples of general structural formulae of conjugated repeat units are:

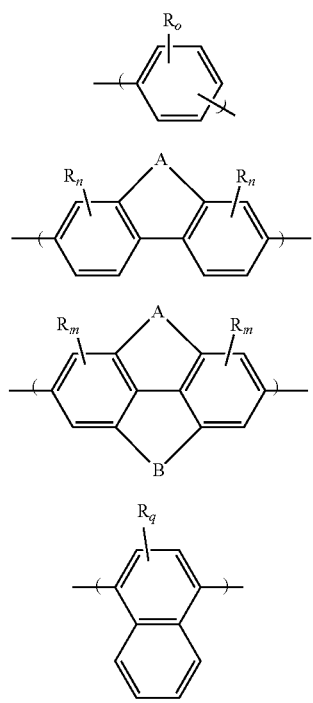

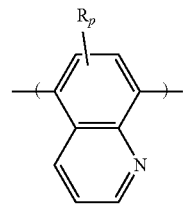

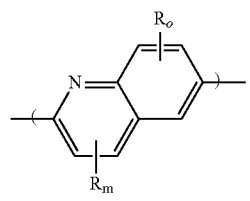

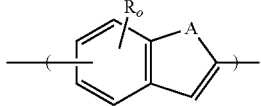

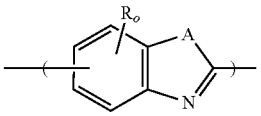

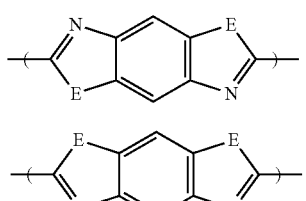

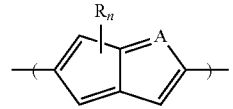

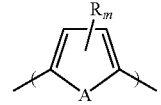

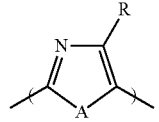

where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; m is 0-2; n is 0-3; o is 0-4; p is 0-5; and q is 0-6; A and B are independently selected from the group consisting of —O—, —S—, —$NR_8$—, and —$CR_1R_2$—, —$CR_1R_2CR_3R_4$—, —N=$CR_1$—, —$CR_1$=$CR_2$—, —N=N—, and —(CO)—, where $R_1$-$R_4$ are H, D, F, alkyl, aryl, alkyleneoxy, polyalkyleneoxy, alkoxy, aryloxy, fluoroalkyl, fluoroaryl; where $R_8$ is H, D, alkyl, aryl, heteroaryl, fluoroalkyl, fluoroaryl, ketone, arylketone, arylester, alkylester, and carboxylic acid; E is selected from the group consisting of O, NH, and S; and where any two adjacent R groups taken together may be bridging. In such an embodiment, the polymer may be any of linear, branched, hyperbranched, and dendritic.

It should also be understood that any of the R groups described throughout this specification whether part of or appended to a polymer, a ligand (polarizable, chelating, or cyclometalating or of any type), or a metal complex, may themselves be polymeric and have any structure including but not limited to linear, branched, hyperbranched, dendritic, graft, block, and comb. For example, a linear conjugated polymer may have side groups R that are hyperbranched polymeric having an overall comb-like or brush-like structure. In another example, a linear conjugated or partially conjugated polymer may have an R group that is a chelating ligand that coordinates to a metal ion that has a cyclometalating ligand that has a dendritic or hyperbranched R group. In this example, because the metal complex has a polymeric structure and is coordinated to a linear polymer the overall structure is again comb-like or brush-like. This comb-like polymer may further be mixed with an additional polymer that may have any structure, for example, a linear partially conjugated electron transport polymer."

The phosphorescent polymers of the present invention also comprise a partially conjugated polymer coordinated to a metal ion or complex. For the purposes of this invention, a partially conjugated polymer is a polymer comprising conjugated blocks or segments and non-conjugated repeat units, segments, or blocks. The conjugated blocks or segments have greater than about 8 conjugated double bonds. Non-limiting examples of general structural formulae of partially conjugated repeat units are:

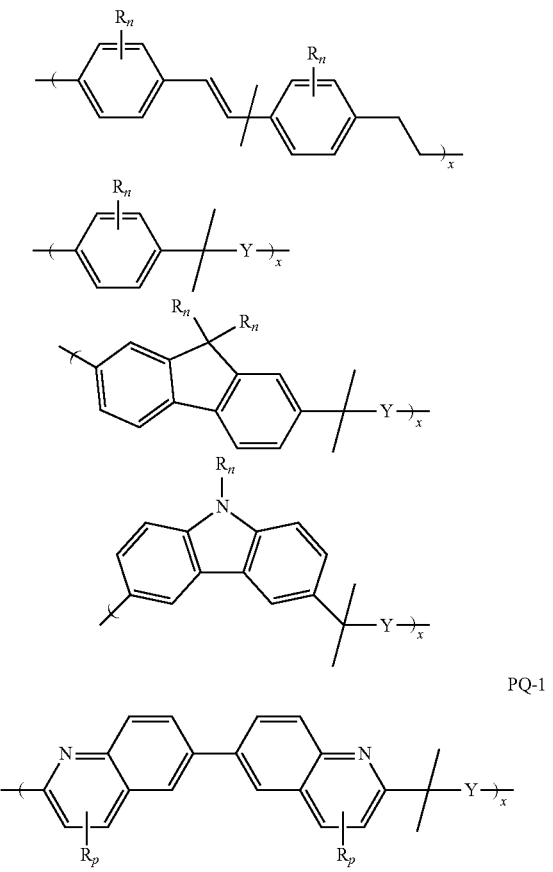

PQ-1 where R is chosen from the group consisting of H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH, n is 1-4, p is 1-5, and R may be on any ring; Y is any repeat unit (non-conjugated in the case of a partially conjugated polyquinoline), e.g. —O—, divalent alkyl, divalent fluoroalkylene, divalent perfluoroalkylene, —$NR_8$—, -aryl-O-aryl-, -aryl-O-aryl-O-aryl, -aryl-NR-aryl-, -alkyl-O-alkyl-, —O-alkyl-O—, and the like; where $R_8$ is H, D, alkyl, aryl, heteroaryl, fluoroalkyl, fluoroaryl, ketone, arylketone, arylester, alkylester, and carboxylic acid; where two of the R groups may be bridging; and where x is the number average degree of polymerization wherein x is from 2 to 10,000, more preferably 3 to 1000, and even more preferably to 4 to 500. It should be understood that even where an "x" is not shown these are the preferred polymer molecular weight ranges. In such an embodiment, the polymer may be any of linear, branched, hyperbranched, and dendritic. A non-limiting example of a partially conjugated polyquinoline is $R_p$ is 4-phenyl and Y is -Ph-O-Ph-C($CH_3$)$_2$-Ph-O-Ph-.

The PLEDs of the present invention also comprise non-conjugated polymers. Non-limiting examples of general structural formulae of non-conjugated repeat units are:

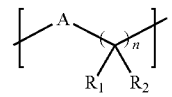

XVI

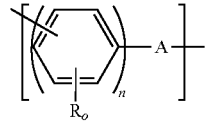

XVII where $R_0$, $R_1$, and $R_2$ are independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; o is 0-4; n is 1-11; A is independently selected from the group consisting of —O—, —S—, —$NR_8$—, and —$CR'_1R'_2$—, —$CR'_1R'_2CR'_3R'_4$—, —N=$CR'_1$—, —$CR'_1$=$CR'_2$—, —N=N—, and —(CO)—, where $R'_1$-$R'_4$ are H, D, F, alkyl, aryl, alkyleneoxy, polyalkyleneoxy, alkoxy, aryloxy, fluoroalkyl, and fluoroaryl; where $R_8$ is H, D, alkyl, aryl, heteroaryl, fluoroalkyl, fluoroaryl, ketone, arylketone, arylester, alkylester, and carboxylic acid; and where any two adjacent R groups taken together may be bridging. In such an embodiment, the polymer may be any of linear, branched, hyperbranched, and dendritic.

In the practice of the present invention, the metal is coordinated to the polymer through a binding group, covalently attached to the polymer. The coordination can occur through cyclometalating units, non-cyclometalating units, chelating units or generally polarizable units and the like. Non-limiting generalized formulae of cyclometalating units contained in the polymers of the present invention are:

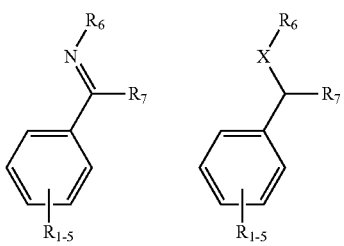

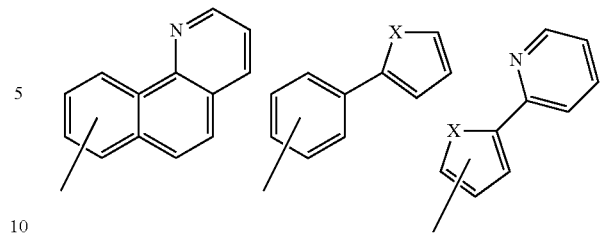

where X is O, S, NH, or $NR_8$; where $R_6$ and $R_8$ are H, D, alkyl, aryl, heteroaryl, fluoroalkyl, fluoroaryl, ketone, arylketone, arylester, alkylester, and carboxylic acid; and where $R_1$-$R_4$ and $R_7$ are H, D, F, Cl, Br, I, alkyl, aryl, alkyleneoxy, polyalkyleneoxy, alkoxy, aryloxy, fluoroalkyl, and fluoroaryl; and where any two adjacent R groups taken together may be bridging. In this embodiment, $R_6$ and $R_7$ taken together may be bridging, non-limiting examples of bridging groups include:

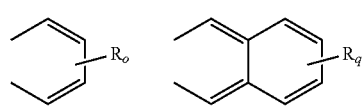

where $R_o$ and $R_q$ are as defined above, where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; o is 0-4; q is 0-6; any of the —CH— units in the bridging ring may be replaced with —N—; and where any two adjacent R groups taken together may be bridging. In such an embodiment, the polymer may be any of linear, branched, hyperbranched, and dendritic.

Non-limiting examples of structural formulae of the cyclometalating units of the present invention are:

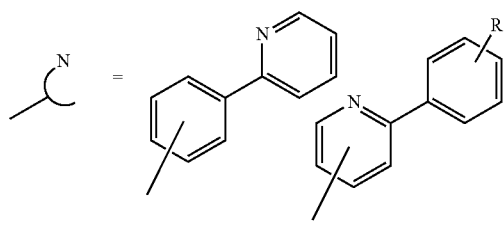

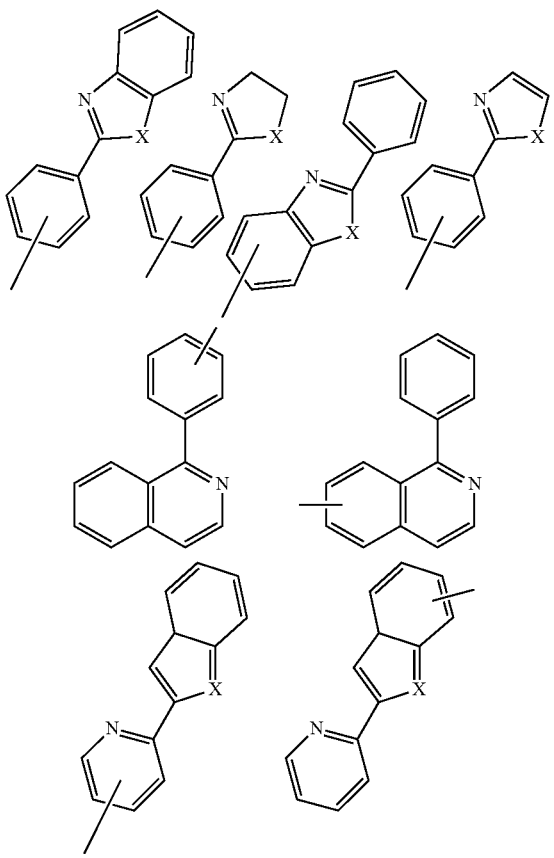

where X is O, S, NH and R is the same as described above, where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; and where any two adjacent R groups taken together may be bridging. In such an embodiment, the polymer may be any of linear, branched, hyperbranched, and dendritic.

Non-limiting examples of structural formulae of conjugated polymers containing cyclometalating units of the present invention are:

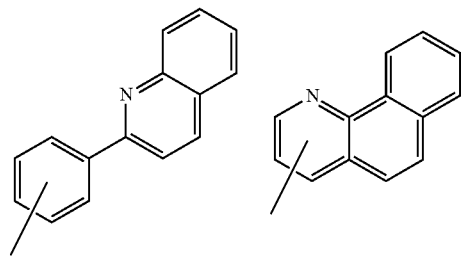

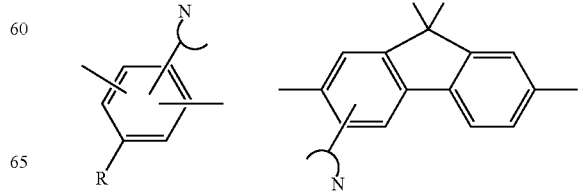

-continued

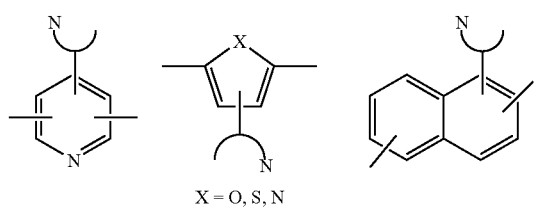

X = O, S, N

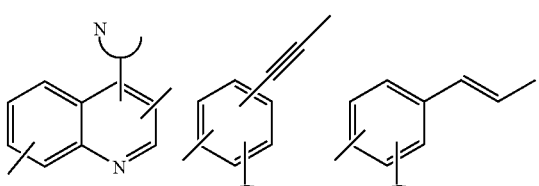

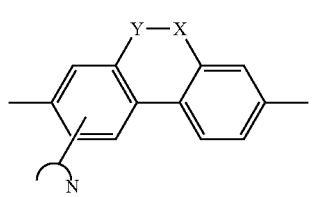

X, Y = CR$_1$R$_2$, O, S, NR$_8$

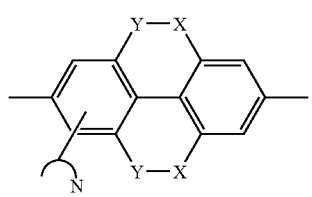

X, Y = CR$_1$R$_2$, O, S, NR$_8$

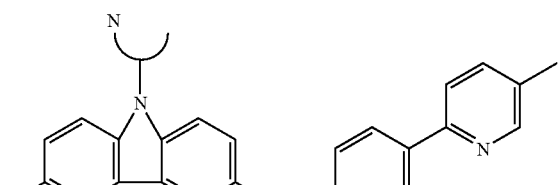

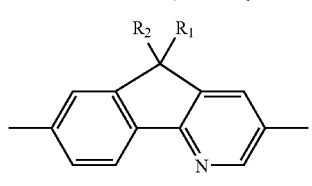

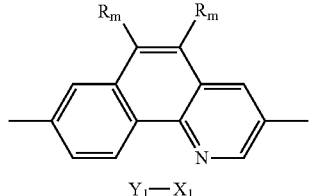

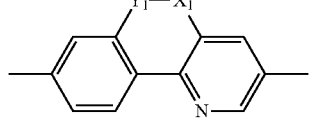

X$_2$, Y$_1$ = CR$_1$R$_2$, O, S, NR$_8$

-continued

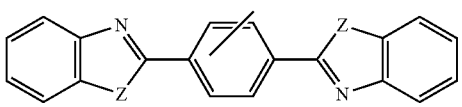

Z = O, S, CR$_2$, NH, NR$_8$

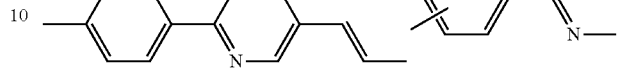

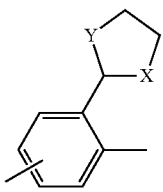

X = O, S, NH
Y = O, S, NH

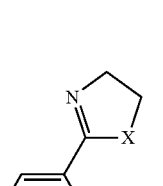

X = O, S, NH
Y = O, S, NH

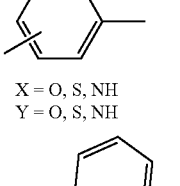

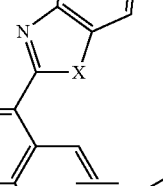

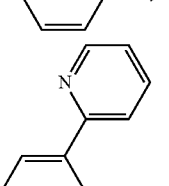

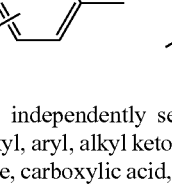

where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, NO$_2$, OH, and SH; m is 0-2; where R$_1$-R$_2$ are H, D, F, Cl, Br, I, alkyl, aryl, alkyleneoxy, polyalkyleneoxy, alkoxy, aryloxy, fluoroalkyl, and fluoroaryl; and where NR$_8$ is H, D, alkyl, aryl, heteroaryl, fluoroalkyl, fluoroaryl, ketone, arylketone, arylester, alkylester, and carboxylic acid; and where any two adjacent R groups taken together may be bridging. In such an embodiment, the polymer may be any of linear, branched, hyperbranched, and dendritic.

Non-limiting examples of structural formulae of non-conjugated polymers containing cyclometalating units of the present invention are:

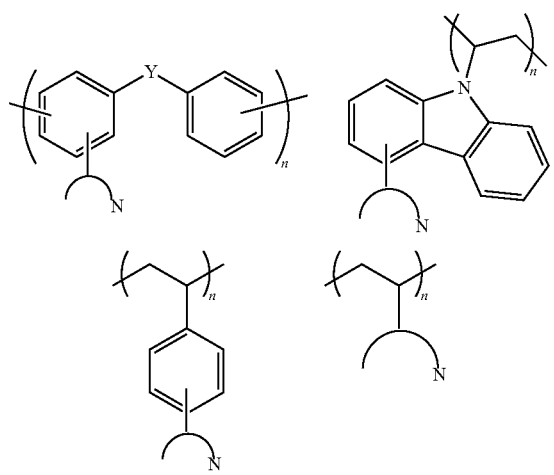

where Y is O, S, $CH_2$, NH, and $NR_8$, where $R_8$ is H, D, alkyl, aryl, heteroaryl, fluoroalkyl, fluoroaryl, ketone, arylketone, arylester, alkylester, and carboxylic acid; where any two adjacent R groups taken together may be bridging; and where n is the number average degree of polymerization wherein n is from 0.2 to 10,000, more preferably 3 to 1000, and even more preferably to 4 to 500.

Non-limiting examples of structural formulae of the non-cyclometalating units of the present invention are:

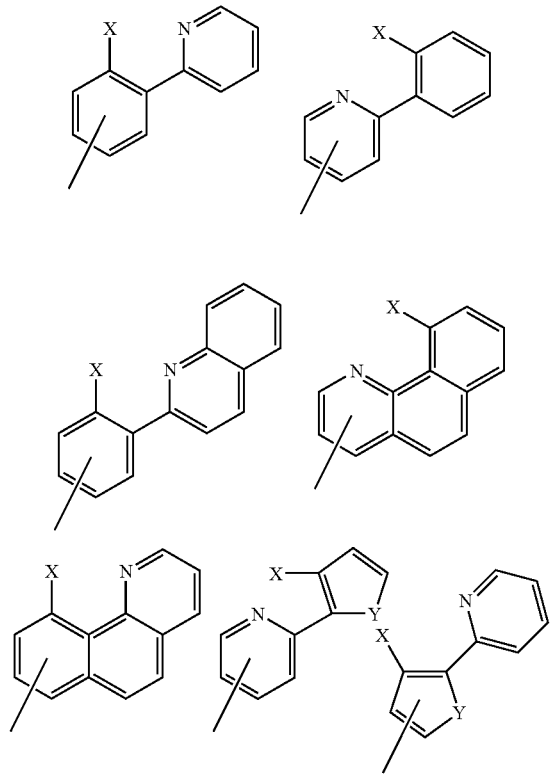

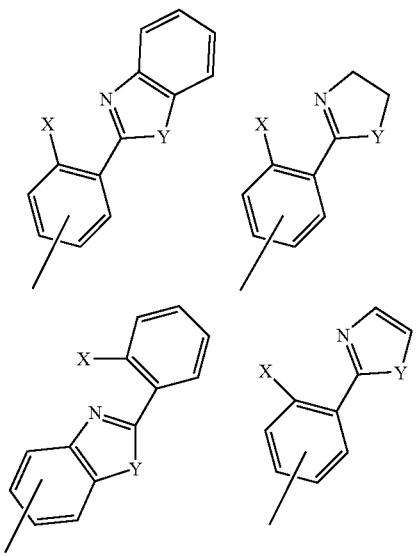

where $X=(-O^-)$, $(-S^-)$, $(-NH^-)$, $(-NR^-_8)$, $(-CO^-_2)$, $N(R_8)_2$, and $P(R_8)_2$; Y=O, S, NH, $NR_8$, where $R_8$ is H, D, alkyl, aryl, heteroaryl, fluoroalkyl, fluoroaryl, ketone, arylketone, arylester, alkylester, and carboxylic acid; and where any two adjacent R groups taken together may be bridging.

Non-limiting examples of polarizable groups of the present invention appropriate for the coordination of the metal ions or complexes to polymers are:

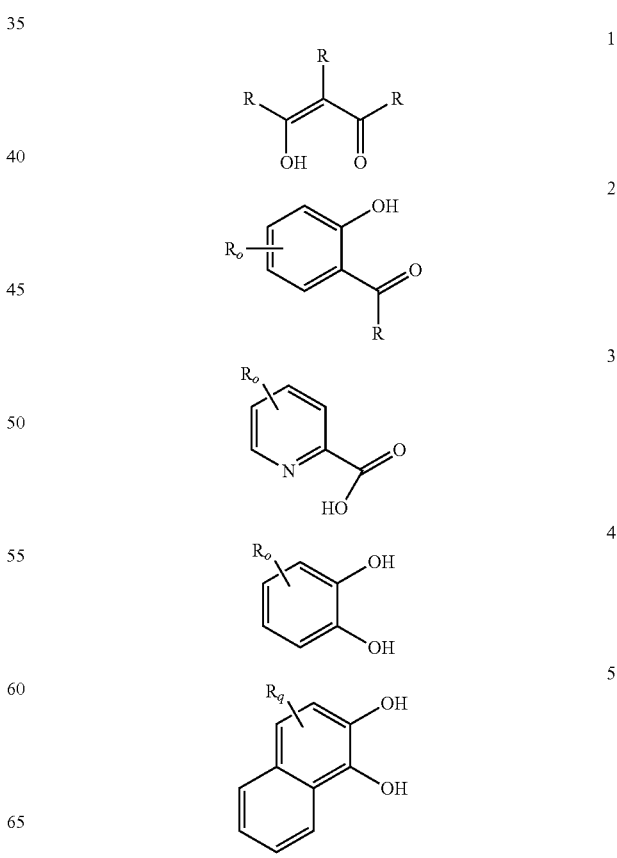

-continued

6
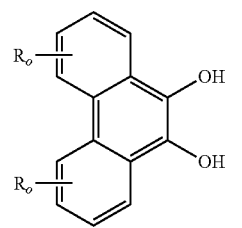

7
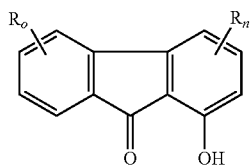

8
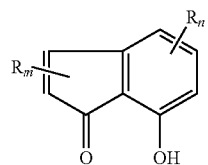

9
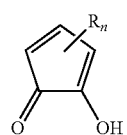

10
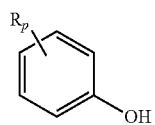

11
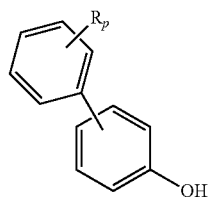

12
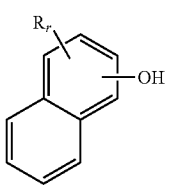

13
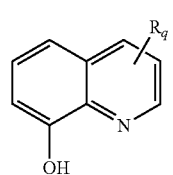

14

-continued

15
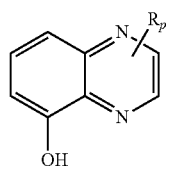

16
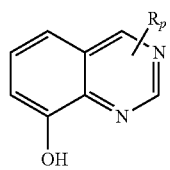

17
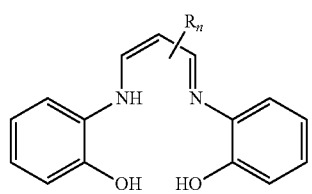

18
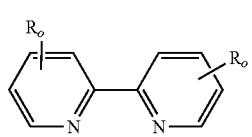

19
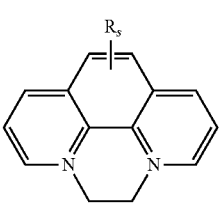

20
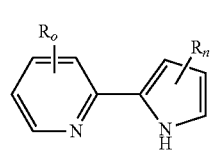

where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; m is 0-2; n is 0-3; o is 0-4; p is 0-5; q is 0-6; r is 0-7; s is 0-8; A and B are independently selected from the group consisting of —O—, —S—, —$NR_8$—, and —$CR_1R_2$—, —$CR_1R_2CR_3R_4$—, —N=$CR_1$—, —$CR_1$=$CR_2$—, —N=N—, and —(CO)—, where $R_1$-$R_4$ are H, D, F, alkyl, aryl, alkyleneoxy, polyalkyleneoxy, alkoxy, aryloxy, fluoroalkyl, and fluoroaryl; where $R_8$ is H, D, alkyl, aryl, heteroaryl, fluoroalkyl, fluoroaryl, ketone, arylketone, arylester, alkylester, and carboxylic acid; E is selected from the group consisting of O, NH, and S; and where any two adjacent R groups taken together may be bridging. In such an embodiment, the polymer may be any of linear, branched, hyperbranched, and dendritic.

The polarizable groups may be present as repeat units in the main polymer chain, or bound to the polymer main chain as a side or end group. The following are non-limiting examples of polarizable groups present in the main polymer chain binding metal ions or complexes:

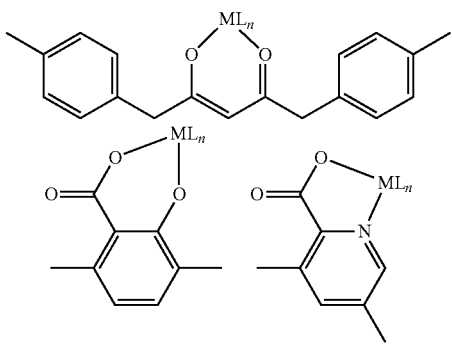

The following are non-limiting examples of polarizable groups present as side chains binding metal ions or complexes:

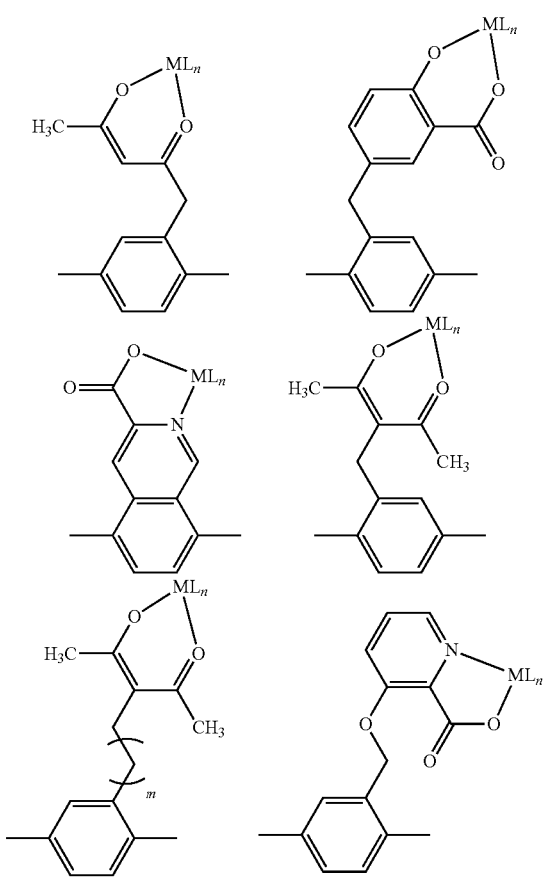

where M is a luminescent metal ion, including Ir, Os, Ru, Au, and Pt; L are additional ligands (charged or neutral) selected independently from the examples above, n is 1-4, and m is 1-17.

The PLED materials of the present invention may be oligomeric, that is comprising a relatively short chain of repeat units. Oligomers may be desired over polymers to achieve lower melt viscosity or ease of synthesis. Oligomers have advantages over small molecules in that oligomers are more readily processed to give amorphous films.

A polymer matrix may be thermoplastic or thermoset. It may be desirable to use a crosslinked or thermoset type polymer to improve the stability of an EL layer. In this case the metal ion or complex is coordinated with a polymer precursor, which is then cured using any means known in the art, including, but not limited to, thermal, UV, e-beam, microwave, photo, and chemical curing. For example, an aromatic bisepoxide containing a cyclometalating unit that is coordinated with a metal ion complex such as iridium bearing ligands such as phenylpyridine, is blended with a (optionally highly aromatic) hardener. The ligands on the metal complex may also contain thermosetting groups, for example, a ligand bearing an epoxy group, which will become part of the polymer matrix on curing. The epoxy/hardener/metal compound is then applied as needed, for example, as a thin film, and cured. It may be desirable to include a solvent in the epoxy/hardener/metal compound to aid film formation, which solvent is removed before, during, or after curing. Similarly, other thermosetting systems may be used, including but not limited to, cyanate ester, ethynyl, maleimide, nadimide, olefin/vulcanizer, phenolic, phenyethynyl, silicone, styrenic, urethane, and the like.

The function of the polymer matrix in phosphorescent PLEDs reported in the literature is primarily to carry charge while the function of the metal ion or complex is primarily to emit light. The PLEDs of the present invention comprising of polymer and metal ions or complexes will probably function in a similar manner to the current phosphorescent OLEDs or PLEDs. In fact the polymeric segment of the PLEDs of the present invention will still function primarily as the charge carriers. However because the metal ion or complex is bound to the polymer chain, the emissive characteristics of the PLED is also affected by the characteristics of the polymer. For example, if fac tris(2-phenylpyridine)iridium [Ir(ppy)$_3$] is coordinated through one of the 2-phenylpyridine ligands directly to a conjugated polymer such as polyphenylene or polyfluorene, its metal-to-ligand charge transfer, MLCT, character will be different than [Ir(ppy)$_3$] either not coordinated or coordinated to a non-conjugated polymer. Alternatively if one of the 2-phenylpyridine ligands on [Ir(ppy)$_3$] where attached to a conjugated polymer chain through an aliphatic spacer group, then the effect of the polymer chain on the MLCT character of [Ir(ppy)$_3$] would be minimal or eliminated. In yet another example in the practice of the present invention, the metal complex bis(2-phenylpyridinato-N,C2') iridium(acetylacetonate) is coordinated to a polymer chain by virtue of the fact that the acetylacetonate group is part of the backbone of the polymer. This will represent coordination through a non-cyclometalated unit and the resulting PLED will have a different electronic and optical character to the examples above. These examples attest to the versatility of the PLED materials of this invention in tuning the electronic and optical properties of the PLED device. Non-limiting examples of polymers containing non-cyclometalating units capable of coordinating to metal complexes are:

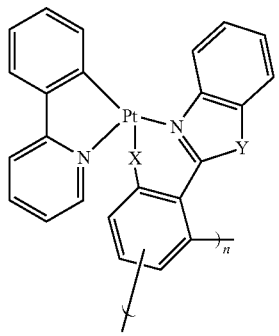

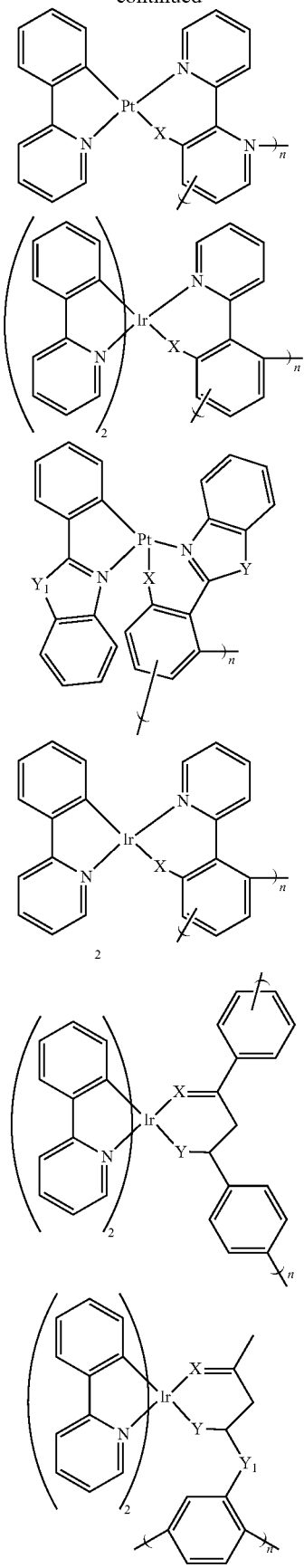

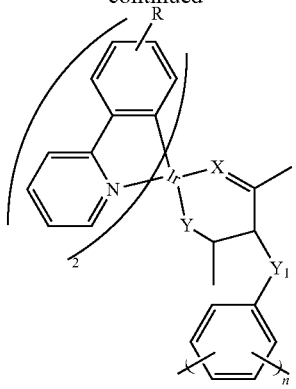

where $X=Y=Y_1=O$, S, NH, and $NR_8$, where $R_8$ is H, D, alkyl, aryl, heteroaryl, fluoroalkyl, fluoroaryl, ketone, arylketone, arylester, alkylester, carboxylic acid; where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; where any two adjacent R groups taken together may be bridging; and where n is the number average degree of polymerization wherein n is from 2 to 10,000, more preferably 3 to 1000, and even more preferably to 4 to 500. In such an embodiment, the polymer may be any of linear, branched, hyperbranched, and dendritic.

The excited state redox potential of metal complexes is of great interest for a variety of applications including light emitting and photovoltaic devices. Its value can be varied through several types of structural modifications including changing the ligands on the metal. Watts et al, *Inorg. Chem.* 1988, 27, 3464 report that [Ir(ppy)$_3$] is a strong photoreductant. On the other hand, [Ir(bpy)$_3$]$^{3+}$ is a strong photooxidant (where bpy is bipyridine), while [Ir(ppy)$_2$ bpy]$^+$ would have intermediate photoredox capabilities. In the operation of OLEDs the redox potential of various species play an important role in the performance and lifetime of the device. Therefore it may be desirable to have OLEDs with tunable redox properties. The PLEDs of the present invention enables such tuning of redox potentials through mixing of ligands on the metal complex. For example a polymer containing bipyridine in the backbone or on the side chain can be coordinated to bis(2-phenylpyridine)iridium thus forming [Ir(ppy)$_2$ bpy]$^+$ species attached to a polymer chain. The charge on such species would be neutralized by an appropriate counterion, known in the art. Non-limiting examples of polymers comprising mixtures of cyclometalating and non-cyclometalating ligands attached to a metal and one or more of which are coordinated to a polymer are:

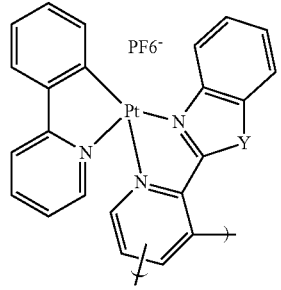

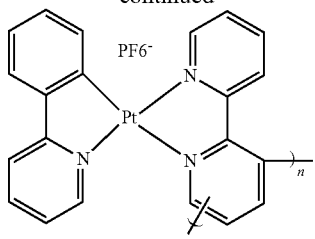
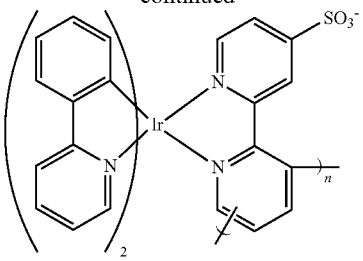
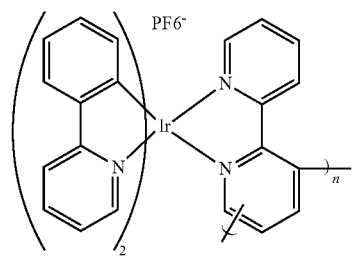
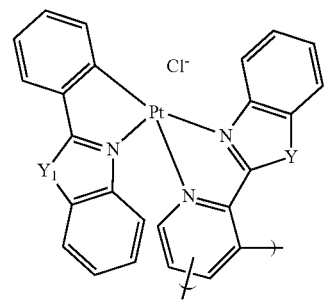
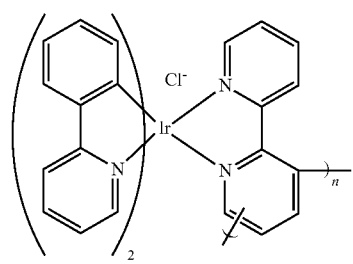

where Y=Y1=O, S, NH; and where n is the number average degree of polymerization wherein n is from 2 to 10,000, more preferably 3 to 1000, and even more preferably to 4 to 500.

The polymers of the present invention are useful in electroluminescent devices. Adjusting the electron or hole transporting properties of the EL material is important to the operation of the OLED. The polymers of the present invention may be electron transporting or hole transporting or both depending on the composition of the polymer backbone. The metal complex can also be electron or hole transporting depending on the metal and the ligands comprising the metal complex. Therefore the polymer of the present invention can comprise of electron donating substituents or electron withdrawing substituents or both. The group on the polymer or on the metal complex responsible for metal to polymer coordination can also comprise of electron donating substituents or electron withdrawing substituents or both. Non-limiting examples of electron donating substituents are RO, RNH, RS, alkyl and aryl, where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, and any two of the R groups may be bridging. Non-limiting examples of electron withdrawing substiuents are F, $CF_3$, Cl, Br, I, $COOR_9$, CN, and $NO_2$, where $R_9$ is H, an alkyl, or an aryl. The phosphorescent polymers of the present invention will also comprise various solubilizing groups to enhance polymerization and processing. These solubilizing groups can be part of the backbone, as side chain, as substituents on coordination units, or substituents on ligands of the metal complex. In such an embodiment, the polymer may be any of linear, branched, hyperbranched, and dendritic.

The phosphorescent polymers of the present invention can be prepared by reacting polymers that contain at least one metal binding ligand with a heavy metal salt precursors as shown in Scheme 1.

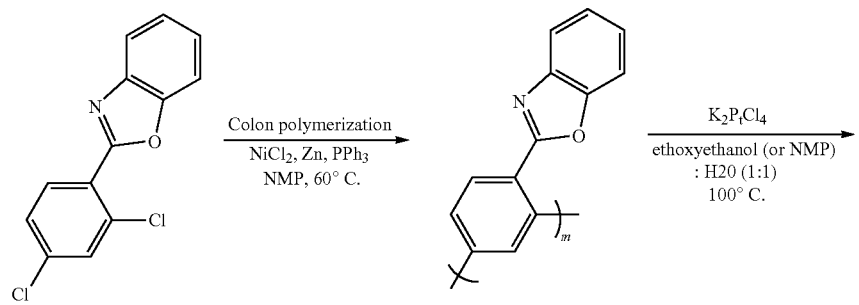

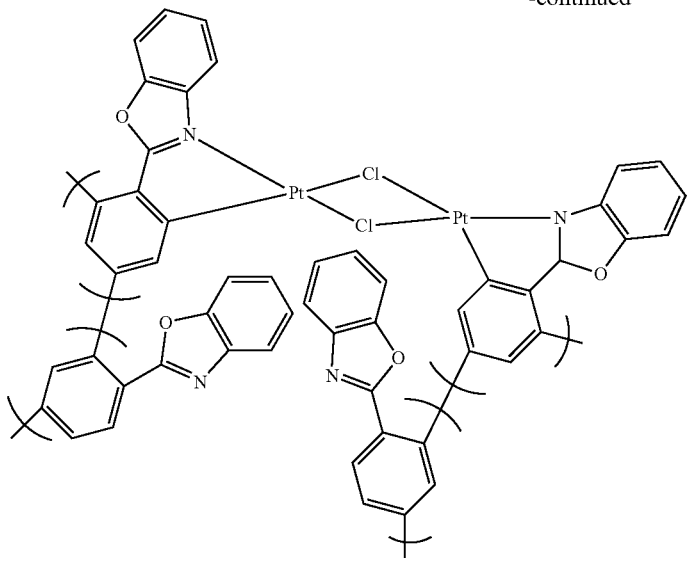
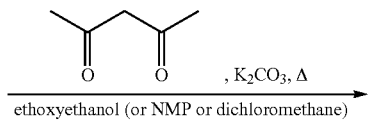
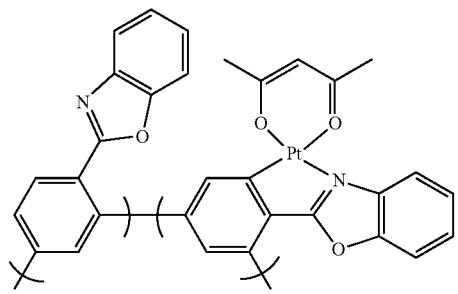
The phosphorescent polymers of the present invention can also be prepared by synthesizing a heavy metal complex monomer followed by the polymerization of such complex monomer, as shown in Scheme 2
Scheme 2:
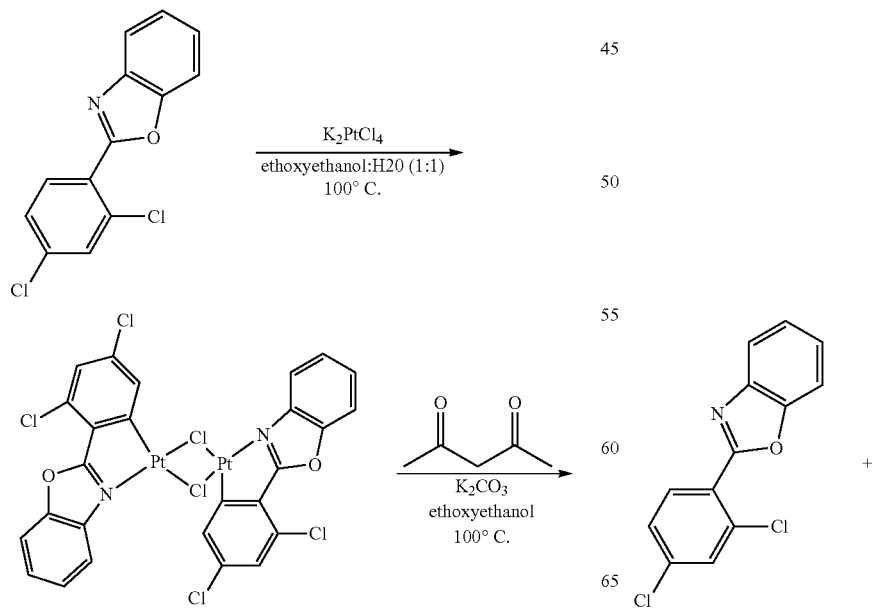
-continued
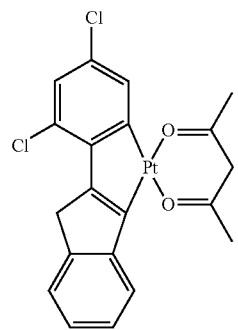

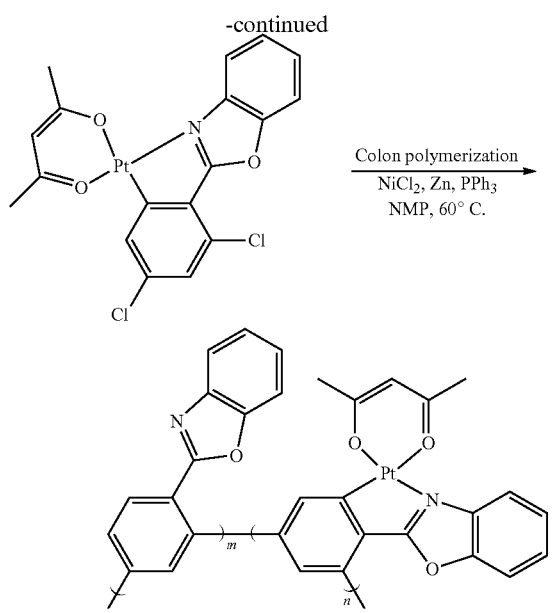

In one embodiment of the present invention the polymer is a polyquinoline. The polyquinoline may have cyclometalating units in the main chain, side chain, and/or as end groups. The polyquinoline may be prepared by any of the several methods known in the art including, but not limited to, Friedlander condensation of bisaminoketones (AA type monomers) with bis ketomethylenes (BB type monomers), Friedlander condensation of monomers bearing an aminoketone and ketomethylene group (AB type monomers), or combinations of AA, AB, and BB monomers, Colon type reductive coupling of dihalogen containing monomers, or nucleophilic substitution polymerization of monomers having halogen atoms activated by a quinoline group with monomers having nucleophilic groups. Non-limiting examples of polyquinolines useful in the practice of the present invention and methods for their preparation are given below.

Polyquinolines may be prepared by the nucleophilic displacement of a bis-fluoro monomer:

Polyquinolines may also be prepared by the Friedlander condensation reaction:

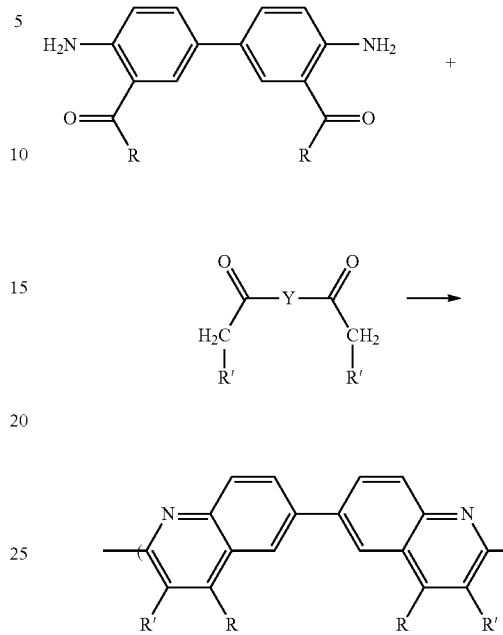

where R and R' are independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; m is 0-2; where any two adjacent R groups taken together may be bridging; and where x is the number average degree of polymerization wherein x is from 2 to 10,000, more preferably 3 to 1000, and even more preferably to 4 to 500. In such an embodiment, the polymer may be any of linear, branched, hyperbranched, and dendritic.

Other methods may be used to prepare polymers containing quinoline repeat units. It should be understood that the utility of the polyquinoline or quinoline containing polymer is not limited by the methods of manufacturing them.

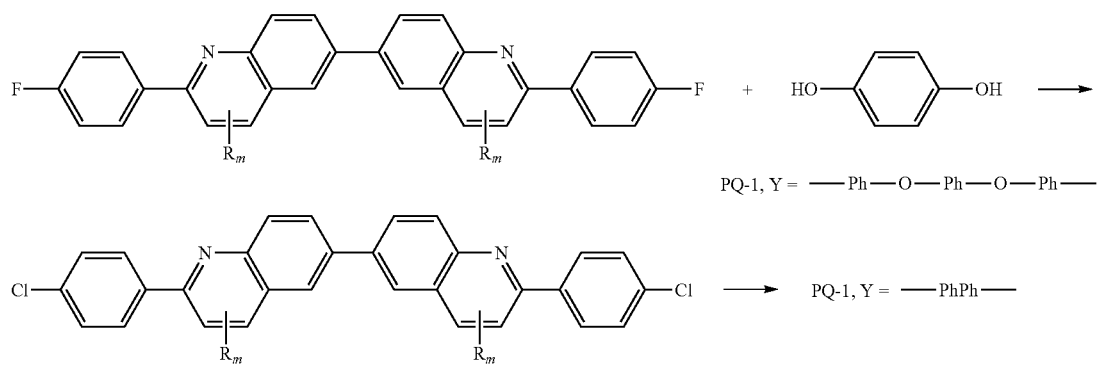

where PQ-1 is:

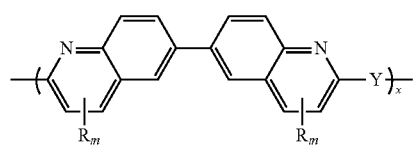

A non-limiting generalized formula of polyquinolines coordinated to a metal ion or complex is:

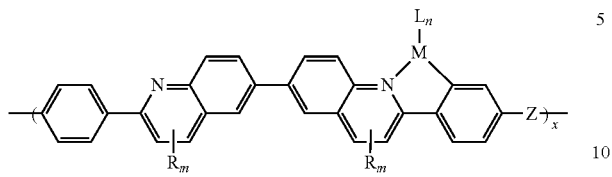

where Z is nil or any repeat unit (non-conjugated or conjugated), e.g. —O—, divalent alkyl, divalent aryl, divalent fluoroalkylene, divalent perfluoroalkylene, —NR$_8$—, -aryl-O-aryl-, -aryl-O-aryl-O-aryl, -aryl-NR$_8$-aryl-, -alkyl-O-alkyl-, —O-alkyl-O—, and the like; R$_8$ is H, D, alkyl, aryl, heteroaryl, fluoroalkyl, fluoroaryl, ketone, arylketone, arylester, alkylester, and carboxylic acid; where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, NO$_2$, OH, SH; m is 0-2; M is a group VIII metal; L are additional ligands (charged or neutral) selected independently from the examples above; n is 1 to 6; where any two adjacent R groups taken together may be bridging; and where x is the number average degree of polymerization wherein x is from 2 to 10,000, more preferably 3 to 1000, and even more preferably to 4 to 500. In such an embodiment, the polymer may be any of linear, branched, hyperbranched, and dendritic.

In another embodiment of the present invention, the metal complex can form part of the backbone of the polymer. The polymer in this case can be conjugated, partially conjugated or non-conjugated. The metal complex can be incorporated into the polymer backbone in a variety of ways. For example, the metal complex bis(5'-bromo, 2-phenylpyridinato-N,C2') iridium(acetylacetonate) can be readily prepared and used as one of the monomers in a Suzuki coupling reaction in conjunction with an aromatic bisboronic acid or ester and other aromatic dibromo monomers. The polymer produced accordingly will have the iridium metal complex incorporated into the backbone of the polymer. There may be several desirable effects associated with such a polymer. For example energy transfer from the polymer chain to the metal complex would be facilitated in this case. Also the electronic properties of such polymer would be very different from systems other phosphorescent polymers described in this application. For example in this case charge trapping may preferentially occur on the polymer as opposed to the metal complex therefore facilitating exciton energy transfer to the metal center. At the same time emission from the polymer segments would be strongly quenched through efficient energy transfer to the metal center. This would be beneficial for device efficiency and color tuning. Non-limiting examples of structures of polymers comprising of metal complexes in the backbone are:

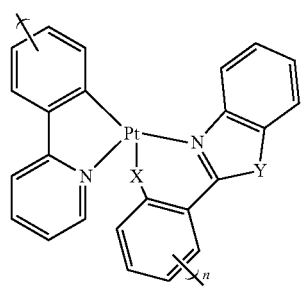

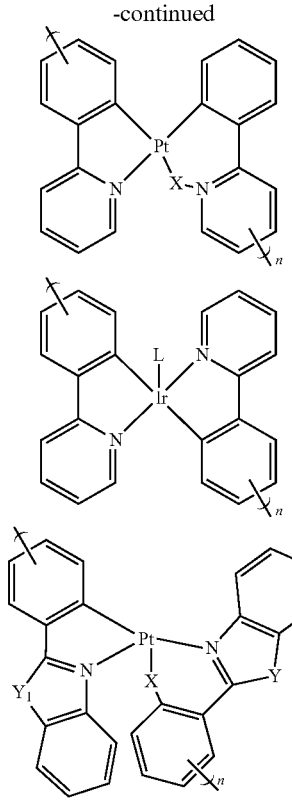

where X=Y=Y$_1$=O, S, NH, NR$_8$, where R$_8$ is H, D, alkyl, aryl, heteroaryl, fluoroalkyl, fluoroaryl, ketone, arylketone, arylester, alkylester, and carboxylic acid; where L is a third ligand and comprises any cyclometalating, non-cyclometalating and polarizable ligand; where any two adjacent R groups taken together may be bridging; and where n is the number average degree of polymerization wherein n is from 2 to 10,000, more preferably 3 to 1000, and even more preferably to 4 to 500.

Other non-limiting examples of suitable polymers comprising metal complexes are shown below:

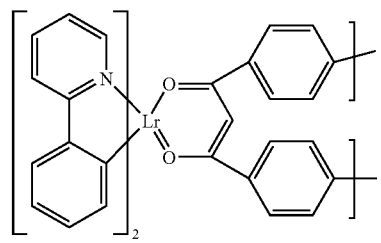

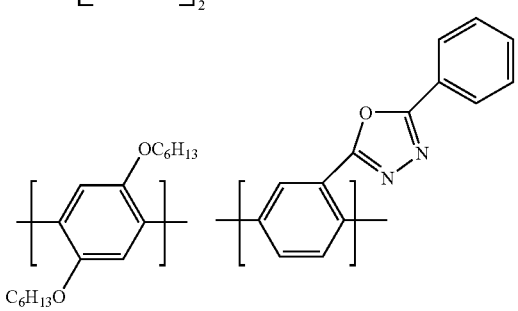

33
-continued
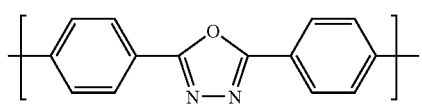
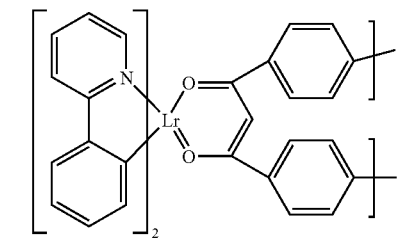
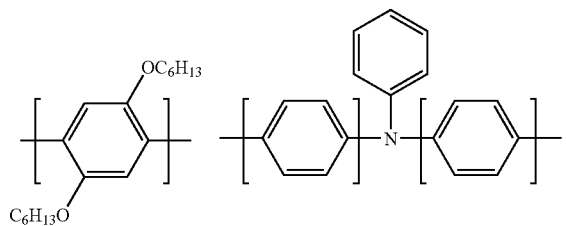
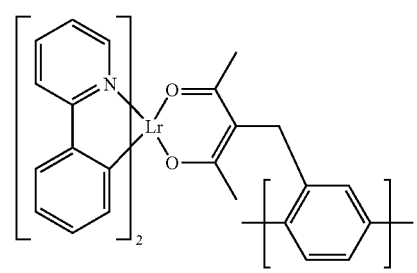
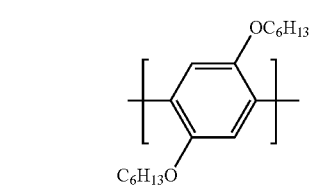
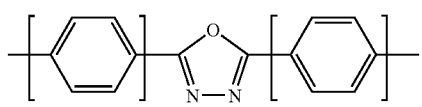
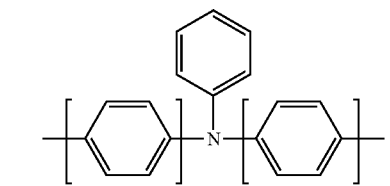
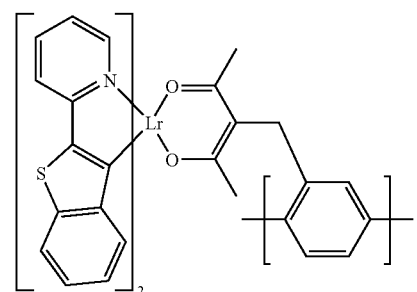
34
-continued
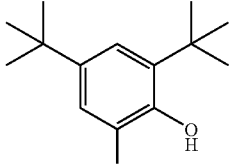
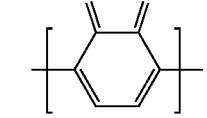
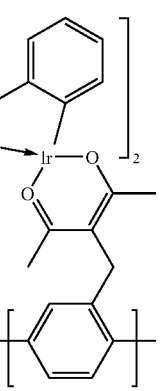
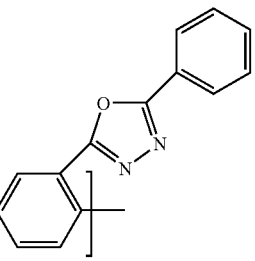
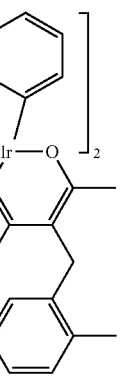
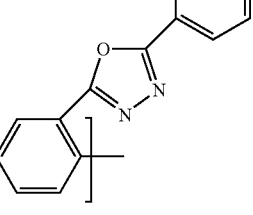

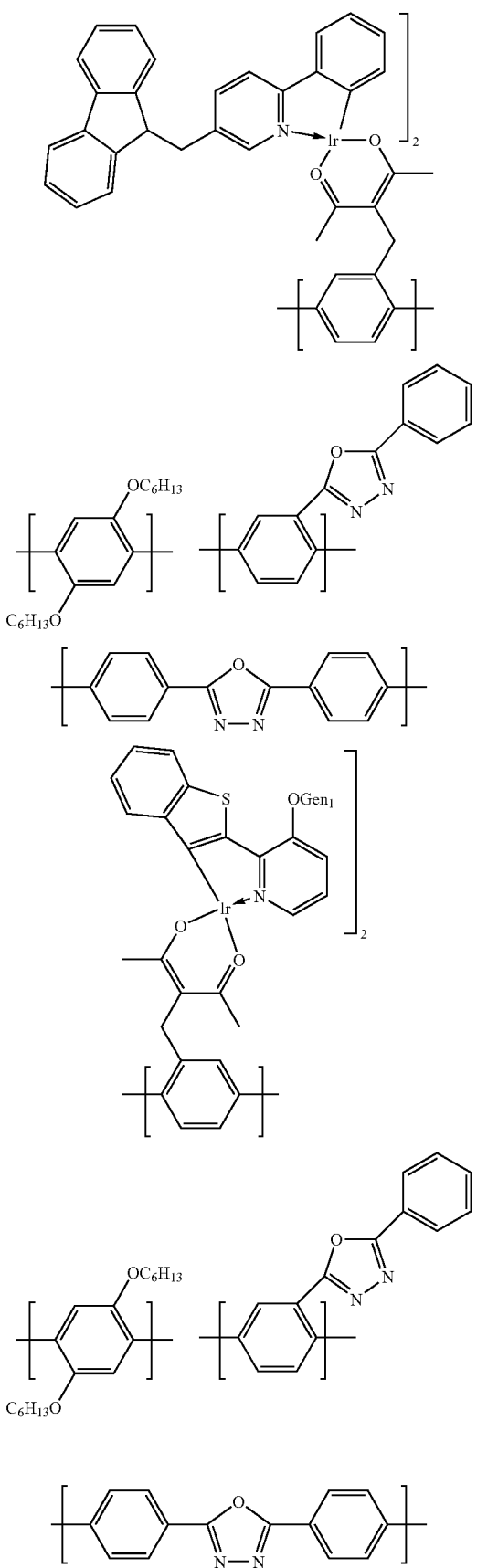
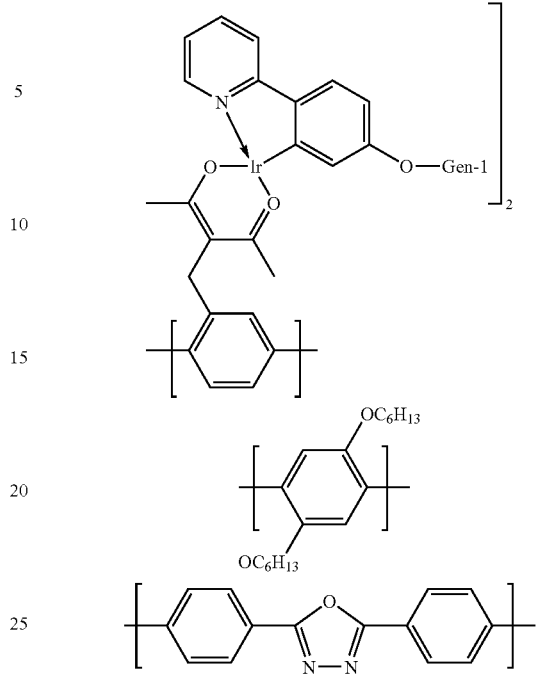

In another embodiment of the present invention, the polymers can be hyperbranched polymers. It is claimed in patent WO 02/066552 that phosphorescent metal-containing dendrimers possess superior electroluminescent properties to their non-dendrimeric metal-complex counterparts. However synthesis of discrete and well organized dendrons and dendrimers is a tedious process involving multiple chemical steps and high cost. Hyperbranch polymers differ from dendrimers in that several highly branched polymer chains are attached to a single focal point. Unlike dendrimers, their structure is not well organized, and are usually amenable to single step synthesis. However their structure allows funnelling of energy to the core, as well as provide a means of separation between luminescent cores. This ease of synthesis and the resulting lower cost is very attractive for practical applications of this class of luminescent materials. Therefore hyperbranched polymers with phosphorescent metal complex cores can be prepared that show high electroluminescent efficiencies.

In another embodiment of the present invention, polymer mixtures are prepared that can emit any desired color including white light, desirable for general lighting applications. White light or other color light can be produced, for example by mixing red, green, and blue or blue and yellow phosphors in appropriate proportions, although it should be understood that many other combinations of colored phosphors may be used to obtain a whit light emission. However efficiency and control of the color of the produced light is usually low because of 1) interaction of neighboring luminescent centers resulting in concentration quenching, and 2) Forster energy transfer from the higher to the lower energy phosphors, i.e. transfer of energy from the blue to the green and red and from the green to the red. However separating the luminescent centers (chromophore) from each other by greater than the Forster radius, speculated to be around 40 angstroms, prevents such energy transfer between luminescent centers resulting in simultaneous emission from all luminescent centers. This can be achieved by placing the luminescent center at the core of a dendrimer or a hyperbranched polymer, resulting in color tunable high efficiency light including white.

The synthesis of the phosphorescent polymers of the present invention is carried out using common synthetic methods known in the art (e.g., Suzuki coupling, Colon coupling, Stille coupling, etc.). It is evident to those skilled in the art that many other routes can be used to prepare the phosphorescent polymers of the present invention, and this report covers all those other routes.

EXAMPLE 1

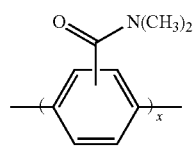

23

Polymer 23 poly-p-(N,N-dimethylamidophenylene) (10 mg) is prepared (as described in U.S. Pat. No. 5,227,457 Example XV, incorporated herein by reference) by placing dry nickel chloride (60 mg., 0.46 mmol), triphenylphosphine (0.917 g, 3.5 mmol), 2,2'-bipyridine (64.7 mg, 0.41 mmol), sodium iodide (0.39 g, 1.44 mmol), and zinc powder (0.92 g, 14.1 mmol) into a 100 ml round-bottom flask. The flask and its contents are heated to 50° C. for 90 minutes under dynamic vacuum to remove trace water. Evacuation is discontinued, and argon is admitted to the flask. Dry dimethylformamide (DMF) (8 ml) is added, and the temperature is raised to 80° C. Within 5 minutes, the mixture turns a deep-red color. After stirring for 20 minutes under argon, a solution of 2,5-dichloro-N,N-dimethylbenzamide (2.016 g, 9.1 mmol) in DMF (5 ml) is added. After 2 hours, the mixture is cooled to room temperature, then poured into 200 ml of 15% aqueous HCl and extracted with benzene. The product, as a suspension in benzene, is washed with 5% HCl. Dichloromethane is added to the thick, white, benzene suspension to give a slightly cloudy solution, which is separated from the remaining water and taken to dryness on a rotary evaporator to give 0.5 g of poly-p-(N,N-dimethylamidophenylene), a white powder. The polymer 23 was dissolved in 1.5 g N-methylpyrrolidinone (NMP). Separately 15 mg EuCl$_3$.6H$_2$O was dissolved in 1.7 g NMP. The solutions were mixed and stirred for two minutes at about 120° C. A portion of this solution was cast onto a microscope slide on a hot plate in air at 120-130° C. An essentially dry film was obtained after a few minutes. Upon exposure of this film to long wavelength UV radiation (~366 nm) red luminescence was observed. As a standard reference, 15 mg of polymer 23 was dissolved in 1.2 g NMP and cast as above. Upon exposure to long wavelength UV radiation, bright blue luminescence was observed. The red luminescence of the polymer 23/Eu$^{3+}$ film diminished when placed in air for an extended period of time. A drop of water was placed on the film. The region of the film contacted by water fluoresced blue.

EXAMPLE 2

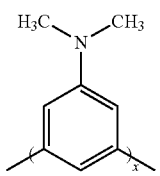

Structure 24

Polymer 24, Poly(1,3-(5-dimethylamino)phenylene), is formed according to the following method. To N,N-dimethyl-3,5-dichloroaniline (1.90 grams, 0.01 mol) in anhydrous NMP (50 ml) is added nickel(bistriphenylphosphine)dichloride (0.109 g, 0.167 mmol), sodium bromide (0.103 g, 1 mmol), and triphenylphosphine (0.262 g, 1 mmol), and zinc dust (1.96 g 0.03 mol) under nitrogen. On addition of zinc the reaction mixture warms. The temperature is held between 70° C. and 85° C. using a cooling or heating bath as needed, for 4 hours. The reaction mixture is then cooled to below 50° C. and poured into 100 ml of isopropanol. The coagulated polymer is filtered and re-dissolved in NMP. The solution is filtered to remove zinc, and coagulated a second time into isopropanol. The coagulated polymer is filtered and dried.

Polymer 24 poly(1,3-(5-dimethylamino)phenylene) (12 mg) is dissolved in 1.2 g NMP. 10 mg EuCl$_3$.6H$_2$O is dissolved in 1.2 g NMP. Half of each solution is mixed together and cast as in Example 1. The other half of polymer PP3 solution is separately cast and dried. Upon exposure to long wavelength UV radiation, the film of pure PP3 luminescence blue while the film of the PP3/Eu$^{3+}$ does not luminesce.

EXAMPLE 3

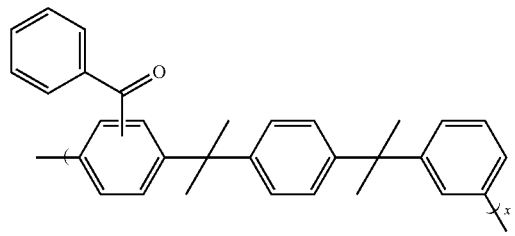

Structure 25

Poly(2,5-benzophenone-co-1,4-phenylene-co-1,3-phenylene), polymer 25, is formed according to the following method. The following compounds were added to a round bottom flask under a nitrogen purge: 2,5-dichlorobenzophenone (1.51 grams, 6.00 mmol), 1,4-dichlorobenzene (0.88 gram, 6.00 mmol), 1,3-dichlorobenzene (7.06 ml, 48 mmol), NMP (53.9 ml), NaI (0.84 gram, 5.60 mmol), triphenylphosphine (3.15 gram, 13.6 mmol), nickelbistriphenylphosphinedichloride (0.523 gram, 0.800 mmol), and Zn dust (5.6 gram, 85.6 mmol). The reaction was heated in an oil bath set to 65° C. The temperature of the reaction mixture increased to 81.1° C. and then returned to 65° C. The reaction mixture was held at 65° C. overnight, after which time the mixture was coagulated into a mixture of ethanol and concentrated hydrochloric acid. The coagulated polymer was washed with hot ethanol and hot acetone and dried. The weight average molecular weight was determined to be 32,333 by gel permeation chromatography (GPC). The yield was 5.265 grams of polymer 25 indicating that some impurities were still present in the coagulated polymer. Films were cast from hot NMP. The films fluoresce blue under long wave ultraviolet irradiation.

Polyphenylene polymer 25 20 (mg) is dissolved in 1.5 g NMP. Separately, 10 mg EuCl$_3$.6H$_2$O is dissolved in 1.2 g NMP. The solutions are mixed and cast as in Example 1. Upon exposure to UV radiation (366 nm) the typical blue luminescence of polymer 25 is observed with no observable diminution in strength or shift in color due to the addition of europium salt.

In Examples 1 and 2, and most notably Example 1, the color of luminescence of the mixture was altered from the blue color of the host polymer, most probably due to energy transfer from the excited state of the polymer to the rare earth metal and the subsequent emission from the metal ion. The red emission in Example 1 indicates emission only from the excited $Eu^{3+}$ ions and the transfer of energy from the excited state of 23 to the $Eu^{3+}$ ions.

Complexation or coordination of the rare earth ion and the polymer appears to be important for energy transfer. Polymers 23 and 24 contain amide and amine moieties in their structure while polymer 25 is purely a hydrocarbon. Complexation of the nitrogen or oxygen containing polymers seems to facilitate energy transfer. In Example 3, Polymer 25 does not contain groups that interact strongly with the europium ion and thus interaction and energy transfer did not take place. In Example 2 polymer 24 has an amine side group which may coordinate to a metal ion. Energy was transferred from the polymer as indicated by quenching of polymer luminescence, however, luminescence of the europium is not observed, indicating that other factors may cause quenching of the rare earth luminescence.

EXAMPLE 4

Polyfluorene polymers, polymer 26, such as, for example, 9,9-di-n-butyl-2,7-dibromofluorene 27 are prepared by the method of Woo, et al, U.S. Pat. No. 5,962,631 the relevant parts of which are incorporated herein by reference. The GPC molecular weight of the polymer 27 is 50,000 to 60,000. To 27 (4.36 grams, 0.01 mol) in anhydrous NMP (50 ml) is added nickel(bistriphenylphosphine)dichloride (0.109 g, 0.167 mmol), sodium bromide (0.103 g, 1 mmol), and triphenylphosphine (0.262 g, 1 mmol), and zinc dust (1.96 g, 0.03 mol) under nitrogen. On addition of zinc the reaction mixture warms. The temperature is held between 70° C. and 85° C. using a cooling or heating bath as needed, for 4 hours. The reaction mixture is then cooled to below 50° C. and poured into 100 ml of isopropanol. The coagulated polymer is filtered and redissolved in NMP. The solution is filtered to remove zinc, and coagulated a second time into isopropanol. The coagulated polymer 26 is filtered and dried.

EXAMPLE 5

Polyfluorene copolymers, polymer 28, are formed according to the following method. 9,9-di-n-butyl-2,7-dibromofluorene 27 is prepared as above by the method of Woo, et al, U.S. Pat. No. 5,962,631.

2,7-dibromofluorene-9-spiro-2'-(1',3',6',9',12',15'-hexaoxacycloheptadecane), Polymer 29

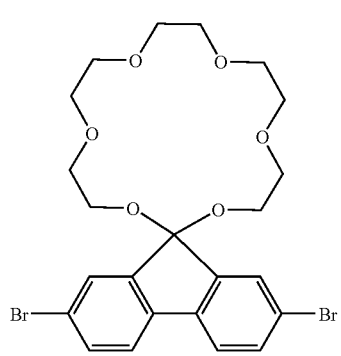

29

To a solution of 2,7-dibromo-9-fluoreneone (33.8 grams, 0.1 mol) in toluene (250 ml), is added penta(ethylene glycol) (23.8 grams, 0.1 mol), and DOWEX® 50WX4-100 ion-exchange resin (5 grams). The mixture is gently refluxed for 8 hours in a dean-stark apparatus to remove water, after which time the mixture is cooled to room temperature and the ion-exchange resin is filtered off. The solvent is removed by distillation at reduced pressure using a rotary evaporator. The resulting product may be used as is or purified by column chromatography.

Alternatively, the crown ether 29 may be prepared following the method of Oshima et al, Bull. Chem. Soc. Japan, 59, 3979-3980, except replacing 9-fluoreneone with 2,7-dibromo-9-fluoreneone.

To 29 (5.58 grams, 0.01 mol) in anhydrous NMP (50 ml) is added 27 (4.36 grams, 0.01 mol), nickel(bistriphenylphosphine)dichloride (0.109 g, 0.167 mmol), and triphenylphosphine (0.262 g, 1 mmol), and zinc dust (1.96 g, 0.03 mol) under nitrogen. On addition of zinc the reaction mixture warms. The temperature is held between 70° C. and 85° C. using a cooling or heating bath as needed, for 4 hours. The reaction mixture is then cooled to below 50° C. and poured into 100 ml of isopropanol. The coagulated polymer 28 is filtered and redissolved in NMP. The solution is filtered to remove zinc, and coagulated a second time into isopropanol. The coagulated polymer is filtered and dried.

EXAMPLES 6-8

Polyfluorene type fluorophors are formed according to the following method. Polyfluorene 28 (10.0 grams) and a metal salt as indicated in Table 1 are dissolved in 100 ml NMP. The solution is spin-coated onto an ITO coated glass substrate to a thickness of about 100 nm. The coated substrate is dried at 100° C. at reduced pressure for 3 hours. The films fluoresce as indicated in Table 1 when irradiated at 366 nm. An aluminum layer of a thickness of about 200 nm is evaporated onto the polymer/metal salt film at about $10^{-6}$ torr. Connections were made to the ITO and aluminum layer with indium-tin solder. A potential is applied to the films with ITO positive and aluminum negative (forward bias), causing the devices to emit light of a color corresponding to the photoluminescence.

TABLE 1

| Example | Metal Salt | Weight | Moles | Luminescence |
|---|---|---|---|---|
| Example 6 | $Tb(NO_3)_3 \cdot 5H_2O$ | 4.35 grams | 0.01 mol | Green |
| Example 7 | $Ce(NO_3)_3 \cdot 6H_2O$ | 4.34 grams | 0.01 mol | Blue |
| Example 8 | $Eu(NO_3)_3 \cdot 5H_2O$ | 4.28 grams | 0.01 mol | Red |

EXAMPLES 9-11

Films of polyfluorene and a polarizable fluorescent metal complex are formed according to the following method. Polyfluorene 28 (10.0 grams), and a metal complex as indicated in Table 2 (dbm is dibenzoylmethane) are dissolved in 100 ml NMP. The solution is spin-coated onto an ITO coated glass substrate to a thickness of about 100 nm. The coated substrate is dried at 100° C. at reduced pressure for 3 hours. The films fluoresce as indicated in Table 2 when irradiated at 366 nm. An aluminum layer of a thickness of about 200 nm is evaporated onto the polymer/metal salt film at about $10^{-6}$ torr. The area covered by the aluminum is controlled using a mask of 1 cm² open area. Connections were made to the ITO and aluminum layer with indium-tin solder. A potential is applied to the films with ITO positive and aluminum negative (forward bias), causing the devices to emit light of a color corresponding to the photoluminescence.

TABLE 2

| Example | Metal Complex | Weight | Moles | Luminescence |
|---|---|---|---|---|
| Example 9 | Eu(dbm)$_3$ | 8.25 grams | 0.01 mol | Red |
| Example 10 | Tb(dbm)$_3$ | 8.32 grams | 0.01 mol | Green |
| Example 11 | Ce(dbm)$_3$ | 8.13 gram | 0.01 mol | Blue |

EXAMPLE 12

Europium doped yttria, $Y_2O_3$:Eu (100 grams) (Superior MicroPowders, Albuquerque, N. Mex.) is added to a solution of polymer 23 (100 grams) in NMP (1 liter). The suspension is mixed well and films are cast onto ITO coated glass substrates to give films of thickness of about 2 microns. An aluminum contact is evaporated onto the film through a mask to cover a 1-cm square section of the film. Under forward bias the film emits red light.

EXAMPLES 13-16

Nanocrystalline phosphor/polymer matrix type electroluminescent systems are formed according to the following method. Nanocrystalline phosphors are prepared according to Ihara et al, as reported in Society for Information Display, International Symposium, 1999. The average particle size is 2 to 3 nanometers. Ten grams of nanocrystalline phosphor is added to 5 grams of polymer 26 (or polymer 23) in 50 ml of NMP. The resulting suspensions are spin cast onto ITO coated glass plates to form thin films between 100 and 500 nanometers. The films fluoresce (PL) under 366-nm irradiation as tabulated in Table 3. The films are then coated with aluminum by vacuum evaporation through a mask with a 5-mm by 10-mm hole. A voltage of 5 to 10 V is applied across the device with the ITO electrode being positive causing electroluminescence (EL) as listed in Table 3.

TABLE 3

| Example | Nanocrystal | Polymer | PL | EL |
|---|---|---|---|---|
| Example 13 | ZnS:Eu | 26 | Red | Red |
| Example 14 | ZnS:Tb | 26 | Green | Green |
| Example 15 | ZnS:EuF$_3$ | 23 | Red | Red |
| Example 16 | ZnS:TbF$_3$ | 26 | Green | Green |

EXAMPLES 17-20

Polymer/Rare Earth Metal Complexes are formed according to the following method. Energy transfer between an aromatic polymer and lanthanide ions was qualitatively examined. NMP was used as co-solvent for all mixtures from which films were cast and dried at around 100° C. in air. Dilute and approximately equivalent concentration solutions of all species were made in NMP. Desired solution mixtures were then prepared by mixing of equivalent amounts of the polymer and metal salt solutions. Films were prepared by casting these solution mixtures onto slides and drying in air at ~100° C. using a hot plate. The dried films were then excited with long wave UV radiation (366 nm) and the luminescence observed. Table 4 shows the luminescence properties of the starting materials. Table 5 summarizes the results for the mixtures.

TABLE 4

| Material | Phase | Luminescence/Color | Comments |
|---|---|---|---|
| 25 | Solid | Blue | Hazy film |
| 23 | Solid | Blue | Clear film |
| 24 | Solid | Blue | Clear brownish |
| EuCl$_3$ | Solution | Red | Clear solution |
| TbCl$_3$ | Solution | Green | Clear solution |

TABLE 5

| Example # | Mixtures | Phase | Luminescence/Color | Comments |
|---|---|---|---|---|
| 17 | 25 + Eu$^{3+}$ | Solid | Blue | Hazy film |
| 18 | 23 + Eu$^{3+}$ | Solid | Red | Clear film |
| 19 | 24 + Eu$^{3+}$ | Solid | None | Clear brownish |
| 20 | 23 + Tb$^{3+}$ | Solid | Weak Blue | Clear |

In Examples 18, 19, and 20 the color of the film fluorescence is altered away from the blue color of the sensitizer or host polymer, most probably due to energy transfer from the excited state of the polymer to the rare earth metal and the subsequent emission from the lattice of the metal ion. This was most pronounced in Example 18 where the red color indicated emission only from the excited Eu$^{3+}$ ions and the transfer of energy from the excited state of polymer 23 to the Eu$^{3+}$ ions. In example 19 the fluorescence of the polymer was quenched indicating energy transfer, however, the Eu fluorescence in the red was too weak to be visible. In Example 20, the weak blue fluorescence indicated only partial energy transfer to Tb, and the green color of Tb fluorescence was not observed. In this set of experiments the N,N-dimethylamido groups of polymer 23 was most effective at transferring energy to Eu$^{3+}$.

EXAMPLE 21

A crosslinked matrix may be formed according to the following method. The bisglycidylether of 4,4'-biphenyl is mixed with 20 mole % of 1-naphthylamine, 500 mole % anisole, and 2 mole % of Eu(acac)$_3$. Optionally, 10 to 50 mole % of a polymer of structures I through XII is added. The mixture is cast into a film and heated to 80° C. under reduced pressure causing simultaneous evaporation of anisole and curing of the epoxy groups. The cured film fluoresces red.

EXAMPLE 22

A photocrosslinked matrix may be formed according to the following method. Monomers 1-vinylnaphthalene (0.1 mol) and divinylbenzene (0.005 mol), photoinitiator (0.001 mol), and tris(8-hydroxyquinolinato)terbium, are mixed and cast as a thin film by spin coating onto an ITO coated glass substrate. The film is immediately exposed to 254 nm light to activate the photoinitiator. The film is then heated to 100° C. for 5 min to remove unreacted monomer. The film fluoresces green. A second electrode of aluminum is deposited onto the luminescent layer by sputtering.

EXAMPLE 23

An alternative photocrosslinked matrix may be formed according to the following method. The same as example 22, except that polystyrene (0.05 mol) is added to the mixture before spin coating to adjust the viscosity of the mixture.

EXAMPLE 24

A small molecule matrix-spiro compound matrix may be formed according to the following method. The spiro compound 22 (0.1 mol) is dissolved in a mixture of toluene (50 ml) and tetrahydrofuran (50 ml) and tris(benzoylnaphthoylmethane)terbium (0.05 mol) and polystyrene (0.01 mol) are added. The resulting mixture is spin coated onto the top of a multilayer structure consisting of glass, ITO, and tris(4-phenylethynylphenyl)amine cured at 300° C. for 1 hour under nitrogen (50 nm). The resulting multilayer structure fluoresces green. A top electrode is formed by evaporation of aluminum. To form tris(4-phenylethynylphenyl)amine, tri(4-bromophenyl)amine (0.1 mol) and phenylacetylene (0.3 mol) are allowed to react in NMP (100 ml) with palladiumdiacetate (0.006 mol), tritolylphosphine (0.012 mol) and triethylamine 0.3 mol) at 80° C. for 16 hours. The triethylammonium bromide is filtered off and the product is purified by recrystalizaton from hexane.

EXAMPLE 25

Monomer 27 (9,9-di-n-butyl-2,7-dibromofluorene) (43.6 gram, 0.1 mol) and 2,7-dibromo-9-fluoreneone (8.45 grams, 0.025 mol) are polymerized using the conditions of Example 5 to give copolymer 30 having the following structure:

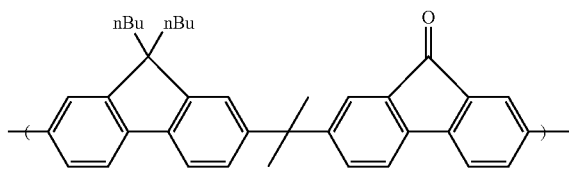

A film is cast from a solution of 30 (1 gram) and europiumtrichloride hydrate (0.1 gram) in NMP (10 ml). The film fluoresces red.

EXAMPLE 26

To form a film containing a hole transport agent, the method of Example 1 is repeated except that N,N'-diphenyl-N,N'-bis(3-methylphenyl)-(1,1'-biphenyl)-4,4'diamine (TPD) 5 mg is added to the first solution in addition to polymer 23. The resulting film has a red fluorescence when irradiated at 366 nm.

EXAMPLE 27

Poly(para-benzoylmorpholine) 31 is prepared (as described in U.S. Pat. No. 5,227,457 Example XVII incorporated herein by reference) by placing anhydrous nickel(II) chloride (50 mg, 0.39 mmol), triphenylphosphine (750 mg, 2.86 mmol), sodium iodide (150 mg, 1.0 mmol), and 325 mesh activated zinc powder (1.2 g, 18 mmol) into a 25 ml flask under an inert atmosphere along with 5 ml of anhydrous N-methyl-pyrrolidinone (NMP). This mixture is stirred at 50° C. for about 10 minutes, leading to a deep-red coloration. A solution of 3 g (11.5 mmol) of 2,5-dichlorobenzoylmorpholine (>99% pure by HPLC analysis) in 10 ml of anhydrous NMP is then added by syringe. After stirring for about 60 hours, the resulting highly viscous solution is poured into 100 ml of 1 molar hydrochloric acid in ethanol to dissolve the excess zinc metal and to precipitate the polymer. This suspension is filtered, and the precipitate triturated with acetone to afford, after isolation and drying, 2.2 g (100% yield) of polyparabenzoylmorpholine as a light tan powder. The inherent viscosity is about 1.8 dL/g. Polymer 31, 10 mg, is dissolved in 1.5 g NMP. Separately, 15 mg Eu(NO3)3.6H$_2$O and 6 mg phenanthroline are dissolved in 1.5 g NMP. The solutions are mixed and stirred for two minutes at 120° C. A portion of the solution is cast onto a glass plate at 120-130° C., and kept hot until dry, and then cooled to room temperature. On exposure to 366 nm UV radiation, red luminescence is observed. A film prepared similarly from a solution containing polymer 31 alone fluoresces blue.

EXAMPLE 28

Copoly-{1,4-(benzoylphenylene)}-{1,4-phenylene} 32 is prepared (as described in U.S. Pat. No. 5,227,457 Example XVII incorporated herein by reference) by placing anhydrous bis(triphenylphosphine) nickel(II) chloride (3.75 g; 5.7 mmol), triphenylphosphine (18 g; 68.6 mmol), sodium chloride (2.0 g, 34.2 mmol), 325 mesh activated zinc powder (19.5 g; 298 mmol), and 250 mL of anhydrous NMP into an oven dried 1-liter flask under an inert atmosphere. (Activated zinc powder is obtained after 2-3 washings of commercially available 325 mesh zinc dust with 1 molar hydrogen chloride in diethyl ether (anhydrous) and drying in vacuo or under inert atmosphere for several hours at about 100°-120° C. The resulting powder should be sifted (e.g. a 150 mesh sieve seems to be satisfactory), to remove the larger clumps that sometimes form, to assure high activity. This material should be used immediately or stored under an inert atmosphere away from oxygen and moisture) this mixture is stirred for about 15 minutes, leading to a deep-red coloration. A mixture of 2,5-dichlorobenzophenone (45 g; 179 mmol) and 1,4-dichloro-benzene (2.95 g; 20 mmol) is then added to the flask. The temperature of the vigorously stirred reaction mixture is held at 60°-70° C. until the mixture thickens (about 30 minutes). After cooling the reaction mixture to room temperature overnight, the resulting viscous solution is poured into 1.2 L of 1 molar hydrochloric acid in ethanol to dissolve the excess zinc metal and to precipitate the polymer. This suspension is filtered and the precipitate is washed with acetone and dried to afford crude resin. The achieve high purity, the crude polymer is dissolved in about 1.5 L of NMP and coagulated into about 4 L of acetone, continuously extracted with acetone, and dried to afford 30 g (89% yield) of an off-white powder. The intrinsic viscosity is 4.2 dL/g in 0.05 molar lithium bromide in NMP at 40° C.

Polymer 32, 1.3 g is reduced using sodium borohydride (1.1 molar equivalent of sodium borohydride for each benzoyl group of 32) in phenethylalcohol, to give polymer 33. Polymer 33 is treated with an excess of acetic anhydride to esterify the alcohol groups resulting from the sodium borohydride reduction, to give polymer 34.

A layer of polymer 34 (about 300 nm thick) is spin cast onto a glass substrate coated with an indium tin oxide transparent conductive layer, which has been coated with Baytron P® (Bayer) of thickness about 500 nm. A layer of calcium is evaporated on top of the layer of polymer 34 as a cathode. Finally, a layer of magnesium is evaporated on top of the calcium to protect the calcium from air. When a voltage is applied between the indium tin oxide anode and the calcium cathode, blue light is emitted.

EXAMPLE 29

Copoly-{1,4-(benzoylphenylene)}-{1,3-phenylene} 35 is prepared (as described in U.S. Pat. No. 5,654,392 Example 16 incorporated herein by reference) by placing anhydrous bis(triphenylphosphine) nickel(II) chloride (10 g; 15 mmol), triphenylphosphine (50 g; 0.19 mole), sodium iodide (15 g; 80 mmol), and 325 mesh activated zinc powder (60 g; 0.92 mole) into a bottle under an inert atmosphere and added to an oven dried 2-liter flask containing 800 milliliters of anhydrous NMP, against a vigorous nitrogen counterflow. This mixture is stirred for about 15 minutes; leading to a deep-red coloration. A mixture of 2,5-dichlorobenzophenone (127 g: 0.51 Mole) and 1,3-dichlorobenzene (11 ml; 96 mmol) is then added to the flask. After an initial slight endotherm (due to dissolution of monomer), the temperature of the vigorously stirred reaction mixture warms to about 80°-85° C. over 30 minutes. After stirring for an additional 10-15 minutes, the viscosity of the reaction mixture increases drastically and stirring is stopped. After cooling the reaction mixture to room temperature overnight, the resulting viscous solution is poured into 6 L of 1 molar hydrochloric acid in ethanol to dissolve the excess zinc metal and to precipitate the polymer. This suspension is filtered, and the precipitate is continuously extracted with ethanol and then with acetone and dried to afford 93 g (94% yield) of crude white resin. To achieve high purity, the crude polymer is dissolved in about 600 mL of methylene chloride, pressure filtered through 1.2 micron (nominal) polypropylene fiber filters, coagulated into about 2 liters of acetone, continuously extracted with acetone, and dried to afford 92 g (93% yield) of a fine white powder. The GPC MW relative to polystyrene is 150,000-200,000.

Polymer 35, 2 g is reduced using sodium borohydride (2 molar equivalent of sodium borohydride for each benzoyl group of 35) in phenethylalcohol to give polymer 36. Polymer 36 is treated with an excess of acetic anhydride to esterify the alcohol groups resulting from the sodium borohydride reduction to give polymer 37. Polymer 37 has a GPC MW of 150,000-200,000 relative to polystyrene. Polymer 37 fluoresces blue-when irradiated at 366 nm. A layer of polymer 36 (about 250 nm thick) is spin cast onto a glass substrate coated with an indium tin oxide transparent conductive layer, which has been coated with Baytron P® (Bayer) of thickness about 500 nm. A layer of calcium is evaporated on top of the layer of polymer 36 as a cathode. Finally, a layer of magnesium is evaporated on top of the calcium to protect the calcium from air. When a voltage is applied between the indium tin oxide anode and the calcium cathode, blue light is emitted.

EXAMPLE 30

Polymer 37 as prepared in Example 28 above, 1 g, is mixed with 0.4 g Eu(NO$_3$)$_3$,6H$_2$O and 0.15 g phenanthroline in 15 ml NMP. This solution is spin cast onto glass plates pre-coated with indium tin oxide and Baytron P® Bayer to give a film of about 200 nm thick. The film fluoresces red when irradiated at 366 nm. A magnesium/silver cathode is evaporated on top of the polymer 37 layer on one of the plates. On a second plate, a 100 nm layer of 2,4-dinaphthyloxodiazole is evaporated onto the layer of polymer 37, followed by evaporation of a magnesium/silver cathode. Both devices emit red light when a voltage is applied across the anode and cathode.

EXAMPLE 31

Preparation of 2,5-dibromobenzyl-penta-1,3-dione may be accomplished according to the following method. 1,4-dibromo-2-(bromomethyl)benzene was prepared according to published procedure (J. Mater. Chem. 8, 2611, 1998). Sodium hydride (2.45 g, 60% in mineral oil) and anhydrous THF (150.0 mL) were charged into a three-neck flask. Pentane-2, 4-dione (24.5 mL, 25.2 mmol), 1,4-dibromo-2-(bromomethyl)benzene (10.0 g, 30.4 mmol) were slowly added into the flask. The mixture was refluxed for 2 hours. The reaction was cooled to room temperature, 50 mL water was added resulting in a transparent solution. The solution was concentrated using rotary evaporation. Another 50 mL water was added and colorless crystals of the product were formed. The solid was collected and washed with water and methanol followed by recrystallization from hexane. Yield: 7.0 g, 66%.

EXAMPLE 32

Preparation of 1,3-bis(4-bromophenyl)propane-1,3-dione may follow the following method. Sodium hydride (2.9 g, 60% in mineral oil), 10 mL DMSO and 10 mL THF were charged into a 3-neck round bottom flask and cooled to 0° C. under a stream of nitrogen. 1-(4-bromophenyl)ethanone (14.2 g, 71.3 mmol), ethyl 4-bromobenzoate (15.0 g, 65.5 mmol) in 10 mL DMSO and 15 mL THF was added dropwise under vigorous stirring. After addition the temperature was raised to room temperature and reaction proceeded for 15 hours resulting in a brown solid. 150 mL ether was added and solid filtered and washed with ether (three times, 60 mL) The solid was poured into 200 mL acidified ice-water and stirred vigorously. The product was filtered, washed with deionized water and recrystalized with toluene. Yield: 14.75 g, 59%.

EXAMPLE 33

Preparation of [(phenylpyridyl)$_2$Ir(3-(2,5-dibromobenzyl)-penta-1,3-dione)] monomer may follow the method wherein 3-(2,5-dibromobenzyl)-penta-1,3-dione (70 mg, 0.20 mmol), sodium carbonate (100 mg, 0.94 mmol), and tetraphenylpyridyldiiriumdichloride (84 mg, 0.078 mmol) were mixed in an 100-mL 1-neck round bottomed flask fitted with a rubber septum. 2-Ethoxyethanol (10 mL) was added via a syringe. The flask was put under vacuum and then filled with nitrogen. The vacuum/nitrogen was repeated three times. The reaction was monitored with TLC. After 1 h of stirring at room temperature the reaction was almost complete as shown by TLC. The solvent was distillated off under vacuum at 100° C. The residue was chromatographed with silica gel using methylene chloride as eluant. The fractions with R$_f$=0.63 were combined and the solvent of the combined fractions was reduced with a rotary evaporator.

Hexanes (20 mL) was added to the solution and a yellow solid precipitated from the solution. The supernatant was decanted and the solid was washed with hexanes (5 mL). The yellow solid was dried under vacuum at room temperature for 2 h. Yield: 100 mg, 76%. The solid was further dried in a vacuum oven at 40° C. for 16 h. 1H NMR: 8.60 (m, 2H, ppy), 7.88 (m, 2H, ppy), 7.77 (m, 2H, ppy), 7.57 (m, 2H, ppy), 7.40 (d, 1H, PhBr$_2$), 7.25 (m, 2H, ppy), 7.23-7.14 (m, 2H, PhBr$_2$), 6.82 (m, 2H, ppy), 6.69 (m, 2H, ppy), 6.28 (m, 2H, ppy), 3.67 (s, 2H, CH$_2$), 1.74 (s, 6H, CH$_3$). MS (m/z, low resolution): 848 ([M]$^+$), 501 ([(ppy)$_2$Ir]$^+$). The isotopic distribution of the molecular ion is consistent with the simulation.

EXAMPLE 34

Preparation of [(2-benzothienylpyridyl)$_2$Ir(3-(2,5-dibromobenzyl)-penta-1,3-dione)] monomer may follow the method wherein 3-(2,5-dibromobenzyl)-penta-1,3-dione (199 mg, 0.591 mmol), sodium carbonate (245 mg, 2.31 mmol), and tetrabenzothienylpyridyldiiriumdichloride (300 mg, 0.231 mmol) were mixed in an 40-mL vial fitted with a septum. Dimethylformamide (10 mL) was added via a syringe and vial was purged with nitrogen for 30 minutes. The mixture was stirred for 60 hours at room temperature. The solution was diluted with 80 mL methylene chloride and washed three times with 80 mL deionized water. The organic layer was separated and dried over magnesium sulfate and concentrated by rotary evaporation. The residue was chromatographed with silica gel using methylene chloride as eluant.

Hexanes (20 mL) was added to the solution and a red solid precipitated from the solution. The supernatant was decanted and the solid was washed with hexanes (30 mL). The red solid was dried under vacuum at room temperature for 2 h. Yield: 160 mg.

EXAMPLE 35

Preparation of [(phenylpyridyl)$_2$Ir(3-(1,3-bis(4-bromophenyl)propane-1,3-dione)] monomer may be prepared in a similar manner to that described in Example 34.

EXAMPLE 36

Preparation of polymer coordinated to a phosphorescent iridium metal complex may follow the method wherein 2,5-bis(ethylboronate)1,4-dihexyloxybenzene (217 mg, 0.52 mmol), 2,5-dibrom-1,4-dihexyloxybenzene (104 mg, 0.392 mmol), 2,5-bis(4-bromophenyl)-1,3,4-oxadiazole (99 mg, 0.26 mmol), 2-benzothienylpyridyl)$_2$Ir(3-(2,5-dibromobenzyl)-penta-1,3-dione (20 mg, 0.021 mmol), paladiumtetrakistriphenylphosphine (0.5 mL), Aliquat 336 (0.35 mL), 2M potassium carbonate solution (0.8 mL) and toluene (1.15 mL) were charged inside a glovebox into a vial fitted with a septum. The reaction was stirred and heated at 95° C. for 18 hours. At the end of the reaction the organic layer was separated, diluted with 10 mL toluene, filtered and the polymer coagulated into a 9:1 mixture of methanol:water, three times. A yellow stringy solid was obtained which was dried under vacuum overnight at 60° C. The polymer had a weight average molecular weight of 51,984 and a polydispersity of 2.17.

EXAMPLE 37

Preparation of a polymer coordinated to phosphorescent iridium metal complex may follow the method wherein 2,5-bis(ethylboronate)1,4-dihexyloxybenzene (217 mg, 0.520 mmol), 2,5-dibrom-1,4-dihexyloxybenzene (91 mg, 0.208 mmol), N,N-bis(4-bromophenyl)benzenamine (105 mg, 0.260 mmol), phenylpyridyl)$_2$Ir(3-(1,3-bis(4-bromophenyl)propane-1,3-dione (4.6 mg, 0.052 mmol), paladiumtetrakistriphenylphosphine (0.5 mL), Aliquat 336 (0.35 mL), 2M potassium carbonate solution (0.8 mL) and toluene (1.15 mL) were charged inside a glovebox into a vial fitted with a septum. The reaction was stirred and heated at 95° C. for 18 hours. At the end of the reaction the organic layer was separated, diluted with 10 mL toluene, filtered and the polymer coagulated into a 9:1 mixture of methanol:water, three times. A yellow stringy solid was obtained which was dried under vacuum overnight at 60° C. 236 mg polymer with a weight average molecular weight of 51,984 and a polydispersity of 2.17 was obtained.

EXAMPLE 38

A single layer polymer light emitting device (PLED) was fabricated using the polymer in Example 36 with the configuration Glass/ITO/PEDOT:PSS/polymer/LiF:Al. It showed pure red electroluminescence peaking at around 620 nm with a peak light output of 1420 cd/m$^2$ @16.5V and power efficiency of 1.21 lm/W @ 35 cd/m$^2$, as shown in FIG. 1. This device was not optimized for efficiency.

EXAMPLE 39

Figure 2:
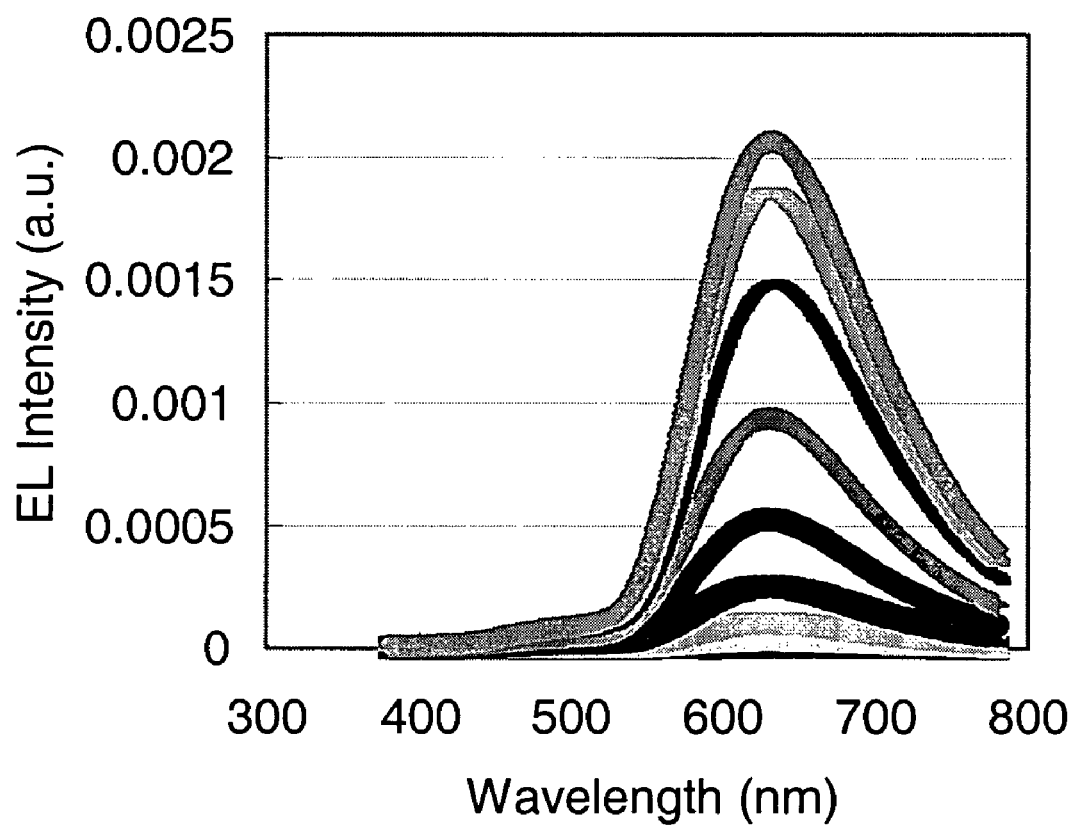
FIG. 2 is a spectrum of the electroluminescent properties of the polymer described in Example 39.

A single layer polymer light emitting device (PLED) was fabricated using the polymer in Example 37 with the configuration Glass/ITO/PEDOT:PSS/polymer:PBD (70:30)/LiF:Al. It showed predominantly red electroluminescence peaking at around 640 nm with a peak light output of 93 cd/m$^2$ @16.5V and power efficiency of 0.014 lm/W @ 86 cd/m$^2$, as shown in FIG. 2. This device was not optimized for efficiency.

EXAMPLE 40

Hydroxyphenylpyridine was prepared by the method wherein K$_2$CO$_3$ (4.86 g) was dissolved in H$_2$O (20 ml) in a 3-neck flask. Toluene (60 ml) was added and a reflux condenser (with gas adapter) was connected to the flask. The flask was purged by alternately evacuating and filling the flask with nitrogen three times. 2-bromopyridine (3.06 g) and a Pd catalyst (Pd(PPh$_3$)$_4$ 0.508 g) were added and the flask purged by applying vacuum then filling with nitrogen three times. Under nitrogen the mixture was heated in an oil bath at 100° C. (±5° C.) for 16 hours. The mixture was then cooled to room temperature and the organic phase was separated. The organic phase was added dropwise to aqueous HCl (1M). A pink crystalline solid was produced from the aqueous phase. The solid was collected on a Buchner funnel, washed with aqueous HCl (1M), then dried in a vacuum oven overnight at 60° C., to give a 62% yield. The NMR was consistent with the expected structure, and GC/MS showed a molecular ion of mass 208.

EXAMPLE 41

Figure 3:
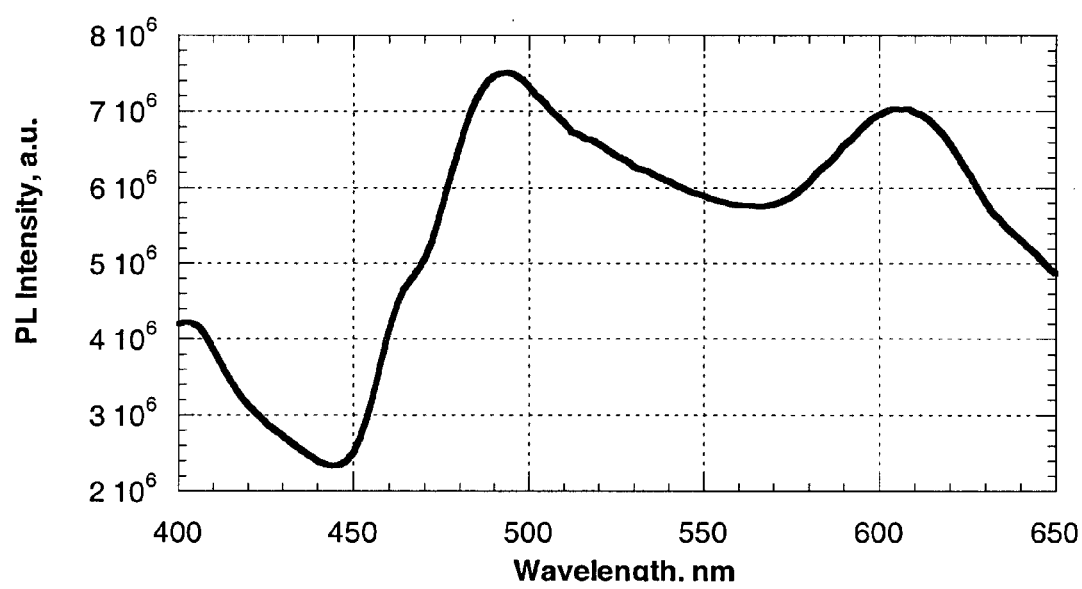
FIG. 3 is a spectrum of the electroluminescent properties of the mixed polymer described in Example 41.

Preparation of PVK films doped with a mixture of 1:1 red and green dendrimers may follow the method wherein 0.324 g red and 0.036 g green and 9.64 g PVK were co-dissolved in DCM. Thin film was cast using spin coating. PL of the film showed both green and red emission, as shown in FIG. 3.

The present invention is also directed to electroluminescent devices incorporating the PLED materials of the current invention and method of constructing such devices using the materials of the current invention. Regardless of the specific PLED formulation chosen from the many exemplary embodiments discussed above, the organic PLED material of the current invention is utilized in any suitable electroluminescent device as a charge carrying matrix. For example, the organic matrix may be chosen to be an electron or hole transport material. Such materials will have a high electron mobility, preferably greater than $10^{-6}$ cm$^2$/V-s, more preferably greater than $10^{-5}$ cm$^2$/V-s, and most preferably greater than $10^{-4}$ cm$^2$/V-s.

A function of the matrix, whether polymeric, oligomeric, or small molecule, is to carry charge (holes and/or electrons) and excited state energy (excitons). Aromatic, polarizable molecules will have these properties, to an extent dependent on their conjugation length, and ability to transfer energy through space; e.g., Förster coupling; see e.g., "Electroluminescent Materials," Blasse and Grabmaier, Chapter 5, 1994, Springer-Verlag, which is incorporated herein by this reference.

The effectiveness of a matrix to transfer energy to a metal, or the effectiveness of a ligand to transfer energy from a matrix to a metal may be determined by measurement of spectra. The UV-vis spectrum of the matrix is measured and the extinction coefficient at 354 nm (or other particular wavelength, 354 is used because it is easily obtained from a mercury lamp and is in the near UV) calculated and noted as $E_{matrix}$. $E_{matrix}$ has units of liter/mole-cm. A series of photoluminescence spectra of the matrix plus metal complex is taken at a metal complex concentration of 0.1 wt % metal and the quantum yield at the wavelength maximum in the visible region is calculated for each and noted as $Phi_{complex}$. $Phi_{complex}$ is unitless. The ratio $Phi_{complex}/E_{matrix}$ is the figure of merit F. The figure of merit F has units of mole-cm/liter. Systems with higher F are better than those with lower F. This test may be modified in particular cases, e.g. it may be desired to use lower concentrations of metal complex to avoid concentration quenching or higher concentrations to improve sensitivity. It may be desirable to integrate the photoluminescence intensity over a finite wavelength range instead of using the wavelength at maximum intensity (Note the units will change accordingly). This test measures the combined efficiency of energy transfer from the excited state of the matrix to the metal (through ligand or otherwise) and emission from the excited metal.

The luminescent matrix of the instant invention is useful in electroluminescent (EL) devices. In an EL device an EL material is sandwiched between two electrodes and a voltage applied. Typically, one of the electrodes is a transparent electrode. Examples of transparent electrodes include, but are not limited to, indium tin oxide (ITO), antimony tin oxide, doped metal oxides such as doped zinc oxide, and doped titanium oxide, polyaniline, PEDOT, very thin metal films such as a 50 nm gold film, and combinations of the above.

EL devices may contain additional layers, including, but not limited to hole transport layers (HTL), electron transport layers (ETL), conducting polymer layers (CPL), metal layers, and layers to seal the device from the atmosphere.

The devices may have mixed layers, for example a layer comprising a hole transport material and a luminescent material. Or a layer comprising a hole transport material, a luminescent material and an electron transport material. One skilled in the art will know how to select HTL and ETL materials.

The devices may have graded or gradient layers. That is, the concentration of a hole transport, a luminescent, or an electron transport material may vary with distance from the electrode in a continuous fashion. Graded layers may be prepared by allowing one layer to diffuse into an underlying layer, or by changing the composition of the layer as it is being deposited.

Figure 4:
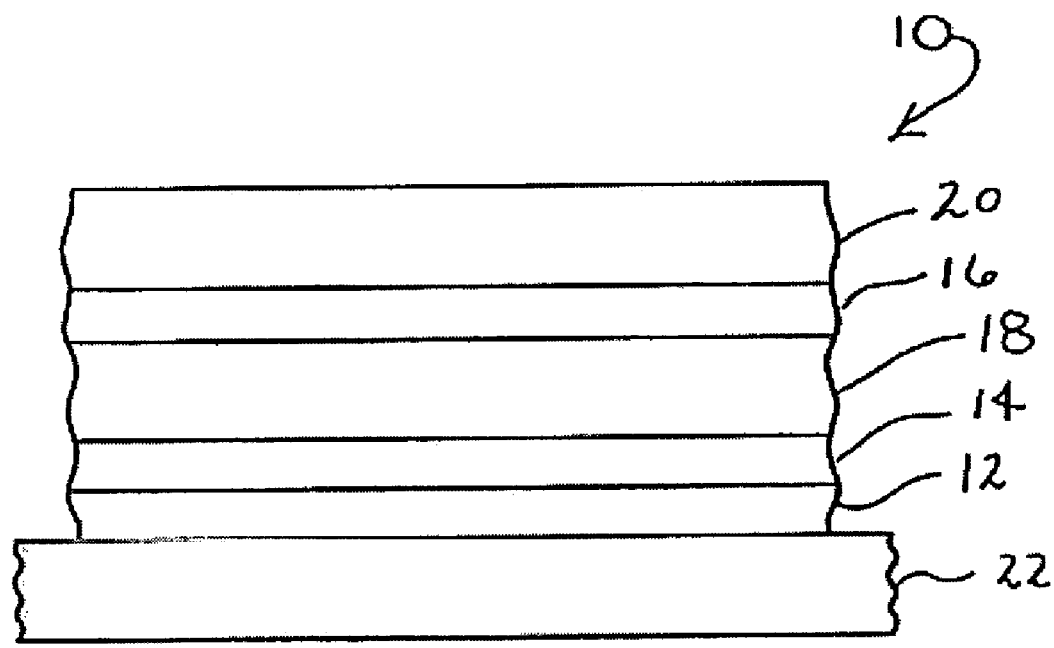
FIG. 4 is a semi-schematic side view of one embodiment of an electroluminescent device provided in accordance with practice of the present invention.
Figure 5:
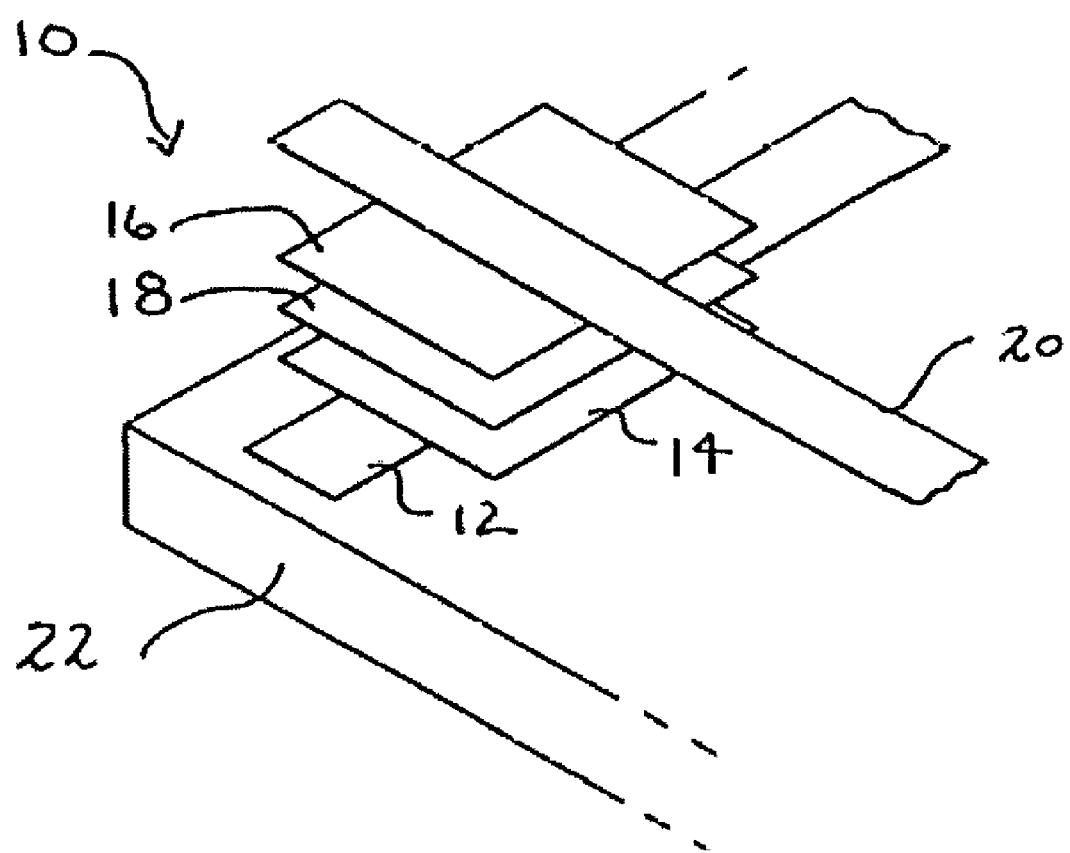
FIG. 5 is a semi-schematic exploded view of the electroluminescent device of FIG. 4.

Turning to FIG. 4, there is shown one embodiment of an electroluminescent device 10 provided in accordance with practice of the present invention. The electroluminescent device 10 includes a transparent conductor 12 which acts as a first electrode. A hole transport layer 14 and an electron transport layer 16 supply holes and electrons, respectively, to an electroluminescent layer 18. A second electrode 20 completes the circuit. The electroluminescent device 10, in this embodiment, is mounted on a substrate 22 which, in some embodiments, can be glass. Other substrates such as plastic can be used if desired. The substrates can be transparent, translucent, or opaque. If the substrate is opaque, the top electrode is preferably transparent. Turning now to FIG. 5, there is shown an exploded view of the electroluminescent device 10 of FIG. 4, where like components are labeled with the reference numerals of FIG. 4.

Figure 6:
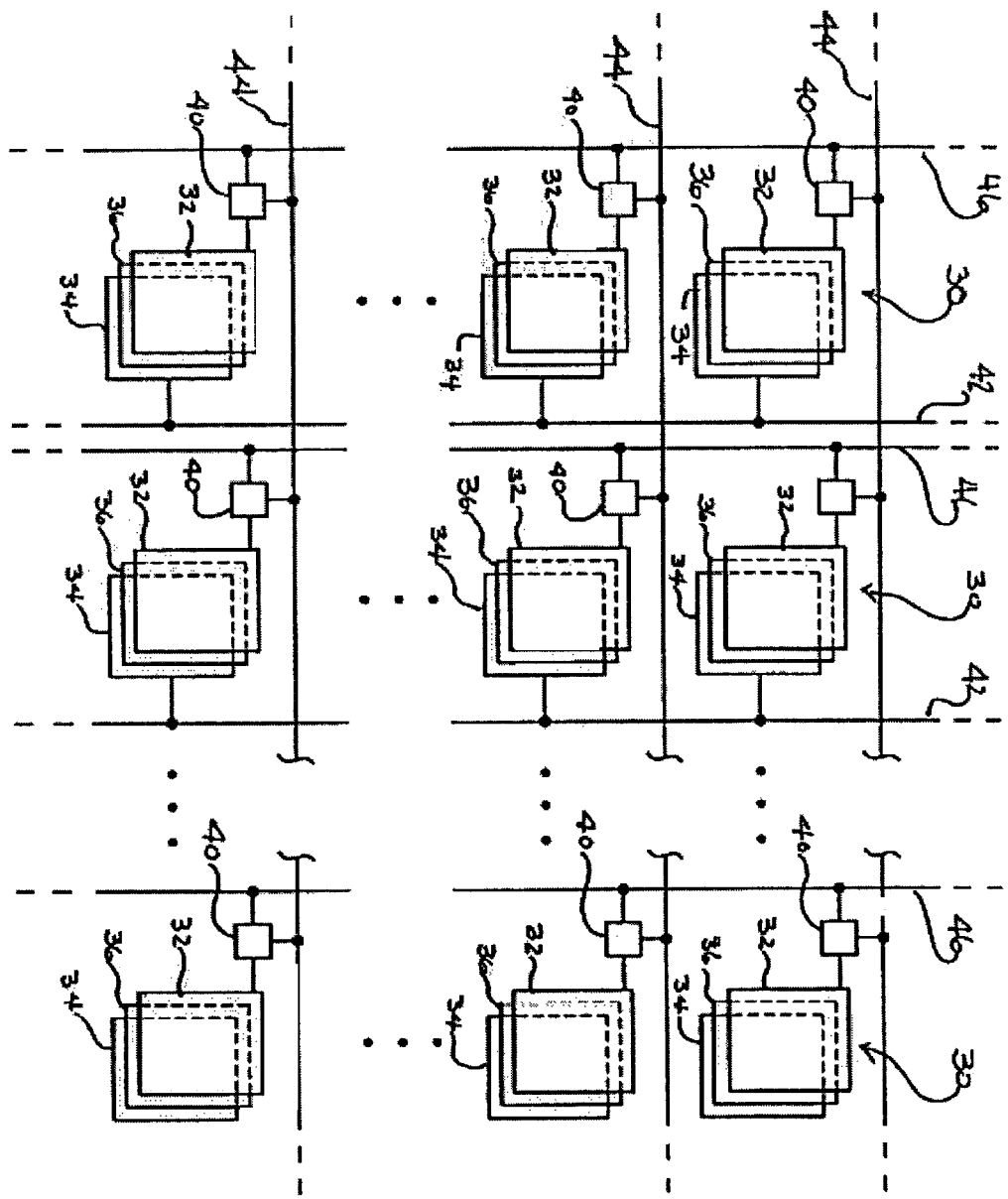
FIG. 6 shows an array of electroluminescent devices extending in two dimensions provided in accordance with practice of the present invention.

Turning to FIG. 6, there is shown an array of cells of electroluminescent devices 30 provided in accordance with practice of the present invention. Each of the electroluminescent devices comprises two electrodes 32 and 34 with an electroluminescent layer 36-sandwiched therebetween. Optionally, a hole transport layer and/or an electron transport layer can be provided on each side of the electroluminescent layer. A driver circuit 40 supplies current to the top electrodes 32. Current-carrying lines 42 are connected to the bottom electrodes 34, and address lines 44 are used to control the current supplied through the driver circuitry 40 and drivelines 46. Each cell may have a different electroluminescent material in the layer 36 to thereby emit a different color. The array shown in FIG. 6 is merely illustrative, and the geometry of the array provided in accordance with the present invention is not limited by the arrangement of the drawing.

Figure 7:
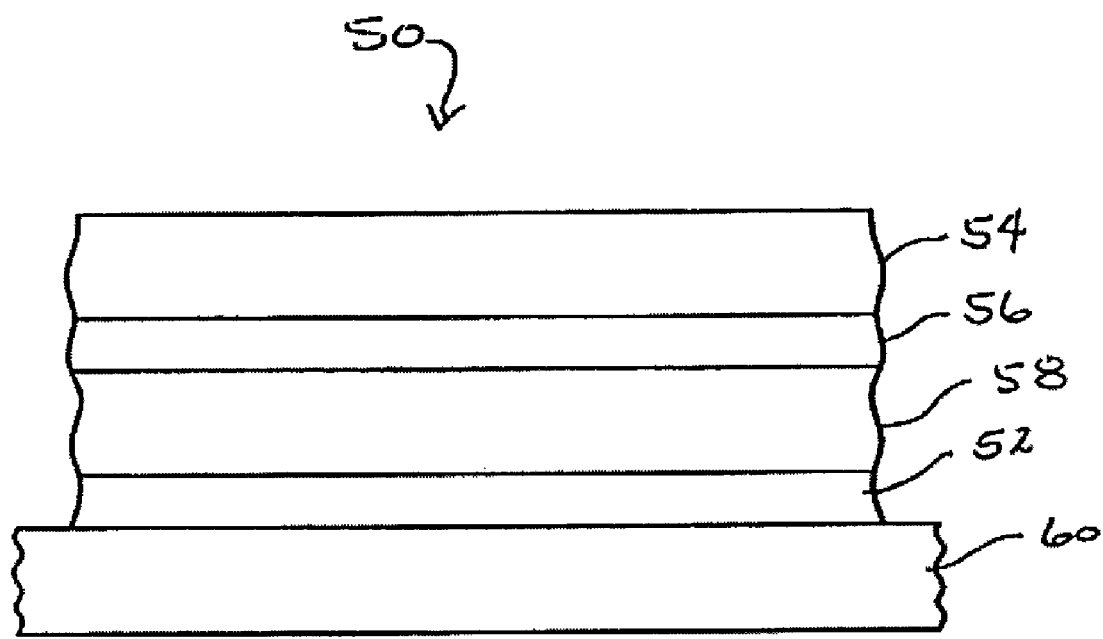
FIG. 7 is a semi-schematic side view of another embodiment of an electroluminescent device provided in accordance with practice of the present invention which comprises an electron transfer layer but no hole transfer layer.

Turning now to FIG. 7, there is shown an electroluminescent device 50 provided in accordance with practice of the present invention which comprises a bottom electrode 52, a top electrode 54, an electron transport layer 56, and an electroluminescent layer 58 mounted on a substrate 60. In this embodiment, there is no hole transport layer, and the electrode 54 supplies current through the electron transport layer 56.

Figure 8:
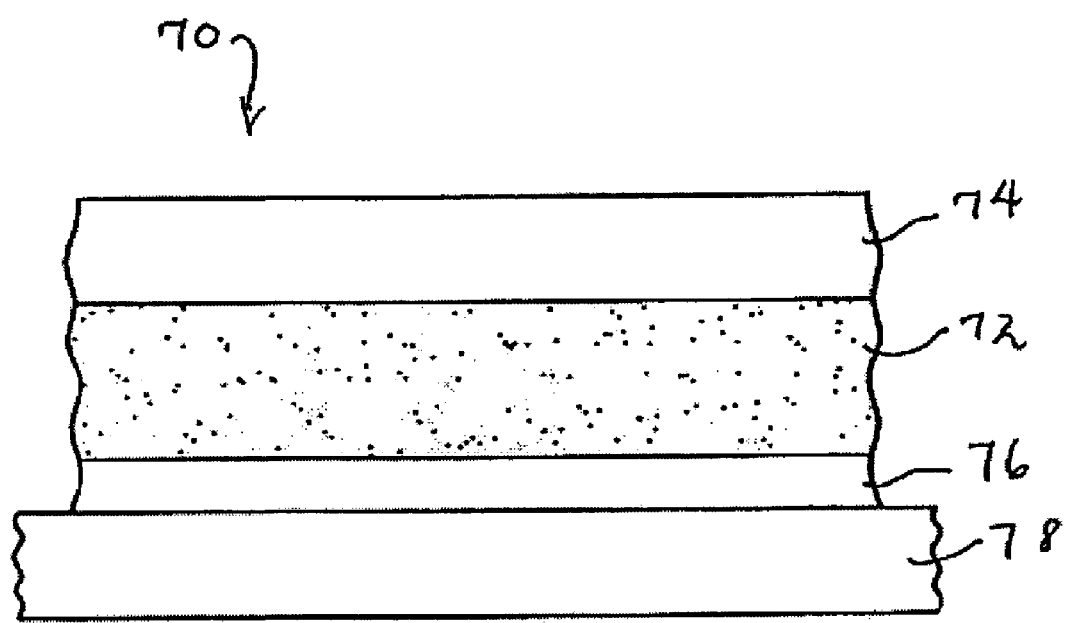
FIG. 8 is a semi-schematic side view of an electroluminescent device provided in accordance with practice of the present invention having a graded electroluminescent layer.

Turning now to FIG. 8, there is shown yet another embodiment of an electroluminescent device 70 provided in accordance with practice of the present invention. The electroluminescent device 70 incorporates a graded electroluminescent layer 72 sandwiched between electrodes 74 and 76. The electroluminescent device 70 is supported on a substrate layer 78. In this embodiment, the graded layer comprises an organic matrix and a luminescent metal ion or luminescent metal complex, and optionally a hole transport material and/or an electron transport material. The concentration of the luminescent metal ion or luminescent metal complex is dependent on position, for example the concentration may be low, or approach zero near the electrodes 74 and 76, and be highest at the center of the layer 72. This arrangement would prevent quenching of luminescence by the electrodes. Similarly, a gradient of hole transport material, e.g. varying approximately linearly from zero near the electrode 74 to the highest near the electrode 76, would aid in hole transport from electrode 76, but not allow holes to reach the electrode 74. Similarly, a gradient of electron transport material from zero near the electrode 76, and highest near the electrode 74, would aid electron transport.

In the absence of a separate electron transport layer and/or a hole transport layer, the organic matrix comprising the electroluminescent layer must carry electrons and/or holes respectively.

With regard to this embodiment, the present invention is also directed to polymer mixtures where two or more polymers that emit different wavelengths of light are combined with an additional polymer or polymers that serve as charge carriers. For example, the composition may consist of a conjugated or partially conjugated charge carrying polymer that has both good hole transport and good electron transport properties, blended with red, blue and green emissive non-conjugated hyperbranched polymers. While not wishing to be bound by theory, this combination allows the red, blue and green emissive centers to be insulated by the non-conjugated hyperbranched polymer thereby minimizing energy transfer between them, and still allows for good charge carrier mobility through the conjugated polymer which acts as a matrix for the emissive polymers. The energy levels of the matrix polymer must be higher than the highest of the emissive polymers, in the above case higher than blue (approximately 420 nm). One skilled in the art will know how to select the matrix polymer to have a high singlet and triplet energy level, for example, by limiting the conjugation as in a partially conjugated polymer, by introducing large side groups that cause a twist in the main chain and thus increase singlet and triplet levels, or by selecting repeat units having high singlet and triplet levels. In another embodiment the matrix is a conjugated or partially conjugated polymer and the emissive polymers are dendrimers.

In another embodiment the emissive polymers may be mixed with a hole transport polymer and a separate electron transport polymer. The amount of hole transport and electron transport polymers may be adjusted to give good charge carrier balance, i.e. approximately the same hole and electron mobility.

The emissive polymers and matrix polymers may be any combination of linear, branched, hyperbranched, and dendrimeric. It is preferred to have the matrix polymer a linear polymer so that the blend will have good film forming properties, and the emissive polymers hyperbranched or dendrimeric so that the emissive centers will be well separated in space. The emissive polymers and the matrix polymers may also be any combination of conjugated, partially conjugated and non-conjugated. One may determine the appropriate amount of conjugation for the matrix polymer by preparation of a series of polymers having a range of conjugation lengths, for example, by preparation of a series of copolymers from a conjugated monomer and a non-conjugated monomer, varying the relative amount of each. Each polymer in the series is then blended with emissive dendrimers and the photoluminescence measured. If the polymer is too highly conjugated and has a triplet state that is too low, the emission from the blend will not appear to be a simple mixture of the emission of the pure dendrimer components, but will have either additional emission from the matrix polymer or reduced emission from the higher energy dendrimer component(s). A trend across the series of blends will allow one to determine if more or less conjugation is needed in the matrix polymer.

Similarly, the optimal amounts of each of the emissive polymers may be determined by preparation of a series of blends with varying concentration of each emissive polymer in the matrix polymer. Starting at very low-concentration (emissive centers very far apart) one will observe independent emission from each color in the blend. As the concentration of emissive polymers is increased the photoluminescent (and electroluminescent) intensity will at first increase (typically up to about 0.5-5% by weight metal atom) after which the intensity will level off and possibly decrease due to concentration quenching. At high concentrations there may be some unwanted energy transfer from higher energy, e.g. blue, to lower energy, e.g. red, emissive polymers. One may use trends in the series to determine optimal concentrations. Concentrations of emissive polymers may be varied independently, e.g. it may be necessary to have a higher concentration of red emissive polymer than blue emissive polymer to achieve the desired output color.

In the various embodiments the emissive layer may be a homogeneous blend, a microphase separated blend, a phase separated blend, or a mixture with any morphology. Phase separation of the red, blue, green (or other combination) components can be beneficial in further separating the components physically thus lowering unwanted energy transfer. One skilled in the art will understand that morphology is a function of film preparation conditions as well as polymer blend composition. Phase separation and morphology of a given composition can be controlled, for example, by choice of solvent, film formation temperature, amount of solvent vapor in the overlying gas phase, spin or casting rate, and the like.

In another embodiment of the present invention the hyperbranched or dendrimeric polymers may have an inner region and an outer region with different chemical composition and different physical properties. In a non-limiting example, a dendrimer has a red emissive core, an inner region comprising non-conjugated units and an outer region comprising conjugated repeat units. This dendrimer may be used without an additional matrix polymer, since the outer region is a good charge carrier, while the inner region serves to insulate the emissive center. This dendrimer may also be used with a matrix polymer that functions primarily as a film former, where the outer dendrimer layer functions as the charge carrier. This dendrimer may also be used with a charge carrying matrix. Mixtures of dendrimers or hyperbranched polymers some having hole transport outer layers and some having electron transport outer layers are also contemplated.

In another embodiment the composition of the emissive layer includes a small molecule as well as polymeric emissive materials. Thus a hole (or electron) transport molecule may be added to a mixture of two or more emissive dendrimers to facilitate hole (or electron) transport. A hole or electron transport molecule may be added to a mixture of two or more emissive dendrimers and one or more matrix polymers to enhance charge transport. For example, a small molecule electron transport material may be used in conjunction with a matrix polymer having good hole transport properties and two or more emissive dendrimers or hyperbranched polymers. Non-limiting examples of hole transport molecules are triphenylamine, tetraphenylbenzidine, phenylcarbazole, tetrathiophene, 4,4'-bis-[N-(1naphthyl)-N-phenylamino]biphenyl (NPD), 4,4',N,N'-dicarbazolebiphenyl (CBP), and the like. Non-limiting examples of electron transport molecules are 4,7-biphenyl[-[1,10]-phenanthroline, tris-8-hydroxyquinolinatoaluminum ($Alq_3$), 2-(4-biphenylyl)-5-(4-tert-butylphenyl)-1,3,4-oxadiazole, 2-(4-biphenylyl)-5-phenyl-1,3,4-oxadiazole, and the like.

Other additives as are known in the art may be used in conjunction with the instant invention. For example, plasticizers, UV-stabilizers, anti-oxidants, surfactants, viscosity modifiers and the like.

The above descriptions of exemplary embodiments of photoluminescent and electroluminescent compositions, the process for producing such compositions, and the photoluminescent and electroluminescent devices produced thereby are for illustrative purposes. Because of variations which will be apparent to those skilled in the art, the present invention is not intended to be limited to the particular embodiments described above. The scope of the invention is defined in the following claims:

What is claimed is:

1. A light emitting composition comprising at least one polymer covalently coordinated to a luminescent or phosphorescent metal ion or metal ion complex, wherein the excited state of the polymer is at a higher energy level than the excited state of the metal ion or metal ion complex such that upon excitation of the composition, the metal ion or metal ion complex removes excited state energy from the covalently coordinated polymer, and further wherein the metal ion or metal ion complex of the composition emits light primarily from a triplet state, or a state of higher multiplicity, wherein the at least one polymer is selected from the group of conjugated, partially conjugated, and a mixture thereof.

2. The composition of claim 1, wherein the polymer is selected from the group consisting of linear, branched, hyperbranched, and dendritic.

3. The composition of claim 1, wherein the phosphorescent metal ion or metal ion complex is selected from the group consisting of group VIII transition metals and gold.

4. The composition of claim 1, wherein the metal ion or metal ion complex comprises at least a metal ion from the group consisting of platinum, iridium, and gold.

5. The composition of claim 1, wherein the composition contains at least one cyclometalating unit bound to a metal ion.

6. The composition of claim 5, wherein the cyclometalating unit is selected from the group consisting of:

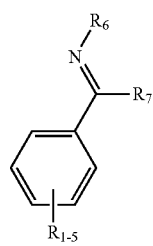

XIV

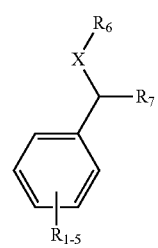

XV where X is selected from the group consisting of O, S, NH, and $NR_8$ $R_1$, $R_2$, $R_3$, $R_4$ or $R_5$ are selected from the group consisting of H, D, alkyl, aryl, F, $CF_3$, Cl, Br, I, CN, $NO_2$, alkoxy, aryloxy, alkylester, arylester, OH, SH, and carboxylic acid; where $R_7$ is selected from the group consisting of H, alkyl, aryl, part of a bridged cyclic ring, a bridged heterocyclic ring, a bridged aromatic ring, a bridged aromatic heterocyclic ring, and a bridged non-aromatic heterocyclic ring; and $R_6$ and $R_8$ are selected from the group consisting of H, D, alkyl, aryl, heteroaryl, fluoroalkyl, fluoroaryl, ketone, arylketone, arylester, alkylester, and carboxylic acid; where any of the R groups may be polymeric and selected from the group consisting of linear, branched, hyperbranched, and dendrimeric; and where any two adjacent R groups taken together may be bridging.

7. The composition of claim 5, wherein the cyclometalating unit is selected from the group:

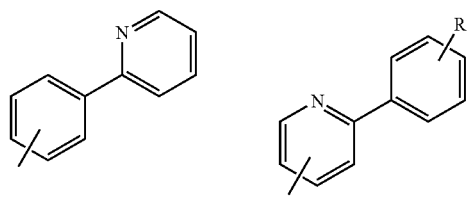

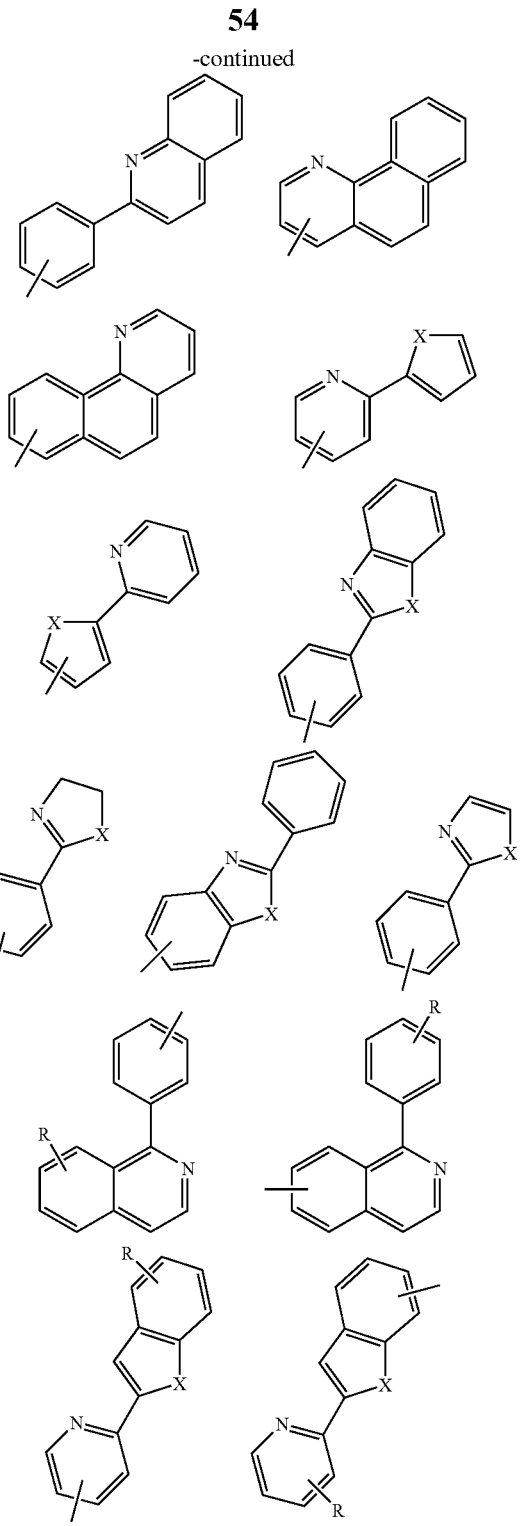

where X is selected from the group consisting of O, S, and NH; and where R is independently selected from the group consisting of H, D, F, alkoxy, aryloxy, alkyl, aryl, alkyl ketone, aryl ketone, alkylester, arylester, amide, carboxylic acid, fluoroalkyl, fluoroaryl, polyalkylene oxy, Cl, Br, I, CN, $NO_2$, OH, and SH; where any of the R groups may be polymeric and selected from the group consisting of linear, branched, hyperbranched, and dendrimeric: and where any two adjacent R groups taken together may be bridging.

8. The composition of claim 5, wherein the cyclometalating unit is one of either covalently attached to the polymer backbone or part of the polymer chain itself.

9. The composition of claim 5, wherein the cyclometalating unit is one of either conjugated or not conjugated to the polymer backbone.

10. The composition of claim 1, wherein the composition contains at least one non-cyclometalating unit bound to a metal ion.

11. The composition of claim 10, wherein the non-cyclometalating unit is selected from the group consisting of:

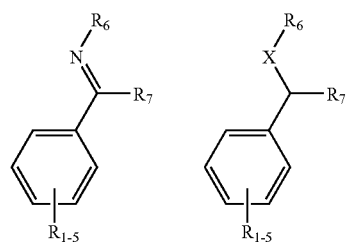

where X is selected from the group consisting of (—O⁻), (—S⁻), (—NH⁻), (—NR⁻$_8$), (—CO⁻$_2$), N(R$_8$)$_2$, and P(R$_8$)$_2$, Y is selected from the group consisting of O, S, and NH; where R$_1$, R$_2$, R$_3$, R$_4$ or R$_5$ are selected from the group consisting of H, D, alkyl, aryl, F, CF$_3$, Cl, Br, I, CN, NO$_2$, alkoxy, aryloxy, alkylester arylester, OH, SH, and carboxylic acid; where R$_6$ and R$_8$ are selected from the group consisting of H, D, alkyl, aryl, heteroaryl, fluoroalkyl, fluoroaryl, ketone, arylketone, arylester, alkylester, and carboxylic acid; where R$_7$ is selected from the group consisting of H, alkyl or aryl, a part of a bridged cyclic ring, a bridged heterocyclic ring, a bridged aromatic ring, a bridged aromatic heterocyclic ring, and a bridged non-aromatic heterocyclic ring; where any of the R groups may be polymeric and selected from the group consisting of linear, branched, hyperbranched, and dendrimeric; and where any two adjacent R groups taken together may be bridging.

12. The composition of claim 10, wherein the non-cyclometalating unit is selected from the group consisting of:

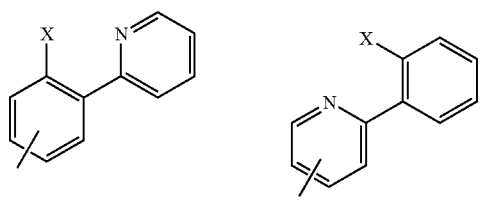

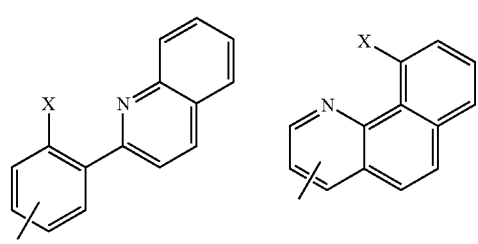

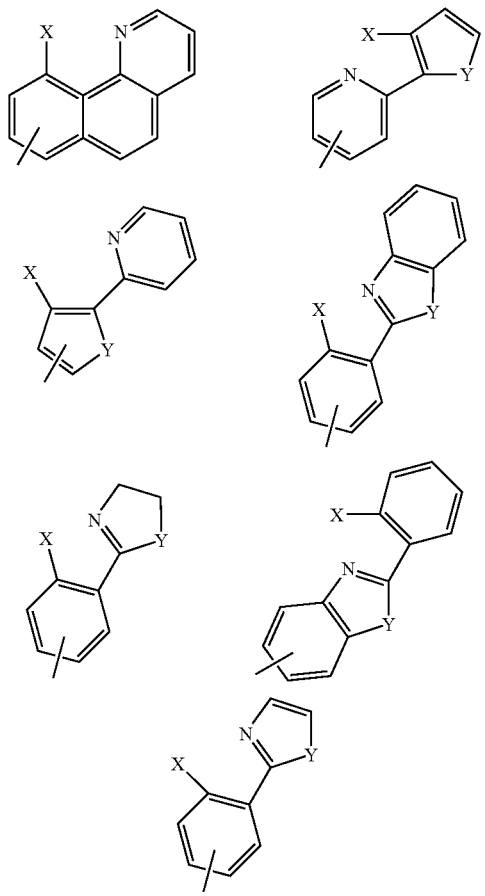

where X is selected from the group consisting of (—O⁻), (—S⁻), (—NH⁻), (—NR⁻$_8$), (—CO⁻$_2$), N(R$_8$)$_2$, and P(R$_8$)$_2$ and Y is selected from the group consisting of O, S, NH, and NR$_8$; where R$_8$ is selected from the group consisting of H, D, alkyl, aryl, heteroaryl, fluoroalkyl, fluoroaryl, ketone, arylketone, arylester, alkylester, and carboxylic acid; where any of the R groups may be polymeric and selected from the group consisting of linear, branched, hyperbranched, and dendrimeric; and where any two adjacent R groups taken together may be bridging.

13. The composition of claim 1, wherein the composition contains at least one polarizable ligand bound to a metal ion.

14. The composition of claim 13, wherein the polarizable ligand is selected from the group consisting of:

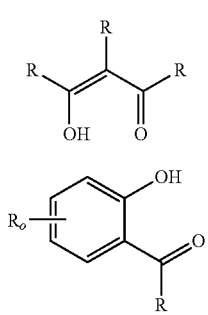

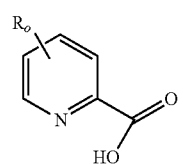
3
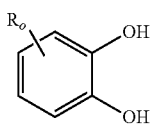
4
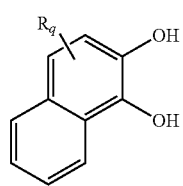
5
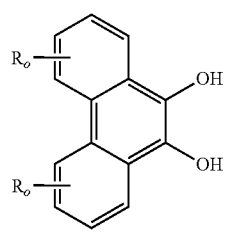
6
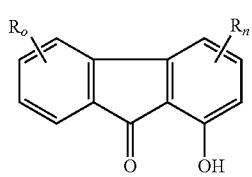
7
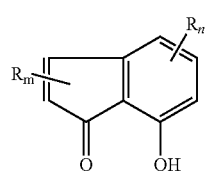
8
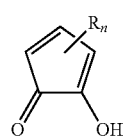
9
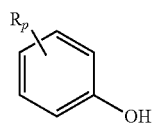
10
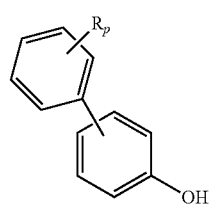
11
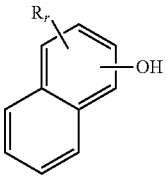
12
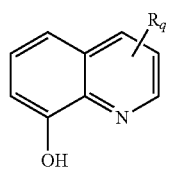
13
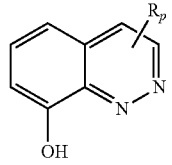
14
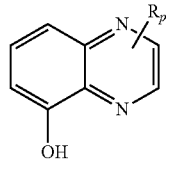
15
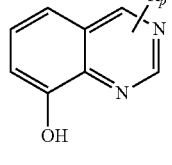
16
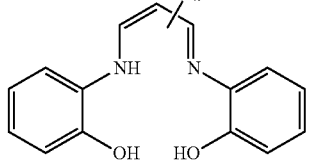
17
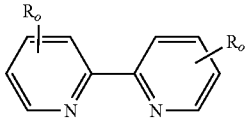
18
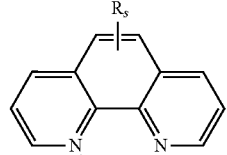
19
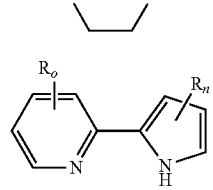
20
where R is independently selected from the group consisting of H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, NO2, OH, and SH; m is 0-2; n is 0-3; o is 0-4; p is 0-5; q is 0-6; r is 0-7; s is 0-8; where any of the R groups may be polymeric and selected from the group consisting of linear, branched, hyperbranched, and dendrimeric; and where any two adjacent R groups taken together may be bridging.

15. The composition of claim 13, wherein the polarizable ligand is part of a polymer chain.

16. The composition of claim 13, wherein the polarizable ligand is one of either conjugated or not conjugated to the polymer backbone.

17. The composition of claim 1, wherein the composition contains at least one cyclometalating unit and one polarizable ligand bound to a metal ion.

18. The composition of claim 1, wherein the composition contains at least one non-cyclometalating unit and one polarizable ligand bound to a metal ion.

19. The composition of claim 1, wherein the composition contains at least one cyclometalating unit and one non-cyclometalating unit bound to a metal ion.

20. The composition of claim 1, wherein the composition contains one cyclometalating unit, one non-cyclometalating unit and one polarizable ligand bound to a metal ion.

21. The composition of claim 1, wherein the phosphorescent metal ion or metal ion complex is present at a concentration of 0.01 to 15 weight % based on the polymer.

22. The composition of claim 1, wherein the phosphorescent metal ion or metal ion complex is present at a concentration of 1 to 10 weight % based on the polymer.

23. The composition of claim 1, wherein the phosphorescent metal ion or metal ion complex is present at a concentration of 3 to 8 weight % based on the polymer.

24. The composition of claim 1, wherein the polymer is a mixture of at least two polymers selected from the group consisting of crosslinked, oligomer, branched, hyperbranched, dendrimeric, block copolymer, random copolymer, and graft copolymer.

25. The composition of claim 24, wherein energy transfer between two metal ion or metal ion complexes is prevented.

26. The composition of claim 1, wherein the polymer is a mixture selected from the group consisting of a mixture of at least two dendrimeric polymers, a mixture of at least two hyperbranched polymers, and a mixture of at least one dendrimeric and at least one hyperbranched polymers.

27. A light emitting composition of claim 1, wherein the polymer is a crosslinked polymer, an oligomer, a branched polymer, a hyperbranched polymer, a dendrimeric polymer, a block copolymer, a random copolymer, or a graft copolymer.

28. The composition of claim 27, wherein the polymer is a crosslinked polymer.

29. The composition of claim 27, wherein the polymer is an oligomer.

30. The composition of claim 27, wherein the polymer is a branched polymer.

31. The composition of claim 27, wherein the polymer is a hyperbranched polymer.

32. The composition of claim 27, wherein the polymer is a dendrimeric polymer.

33. The composition of claim 27, wherein the polymer is a block copolymer.

34. The composition of claim 27, wherein the polymer is a random copolymer.

35. The composition of claim 27, wherein the polymer is a graft copolymer.

36. A light emitting composition comprising at least one polymer covalently coordinated to a luminescent or phosphorescent metal ion or metal ion complex, wherein the excited state of the polymer is at a higher energy level than the excited state of the metal ion or metal ion complex such that upon excitation of the composition, the metal ion or metal ion complex removes excited state energy from the covalently coordinated polymer, and further wherein the metal ion or metal ion complex of the composition emits light primarily from a triplet state, or a state of higher multiplicity, wherein the composition comprises a mixture of the at least one polymer and at least one at least partially conjugated charge carrying polymer that is at least one of a hole and electron transport material, wherein the at least one polymer is selected from the group of hyperbranched and dendrimeric and is at least partially conjugated.

37. The composition of claim 36, wherein the charge carrying polymer is linear.

38. The composition of claim 36, wherein the charge carrying polymer is conjugated.

39. The composition of claim 36, wherein the charge carrying polymer is both a hole and electron transport material.

40. The composition of claim 36, wherein the at least one polymer comprises at least two polymers that emit at different wavelengths.

41. The composition of claim 36, wherein the mixture has a morphology selected from the group of a homogenous blend, a microphase separated blend, a phase separated blend, and a mixture thereof.

42. A light emitting composition comprising at least one polymer covalently coordinated to a luminescent or phosphorescent metal ion or metal ion complex, wherein the excited state of the polymer is at a higher energy level than the excited state of the metal ion or metal ion complex such that upon excitation of the composition, the metal ion or metal ion complex removes excited state energy from the covalently coordinated polymer, and further wherein the metal ion or metal ion complex of the composition emits light primarily from a triplet state, or a state of higher multiplicity, wherein the polymer comprises repeat units selected from the group consisting of:

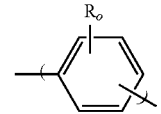

I

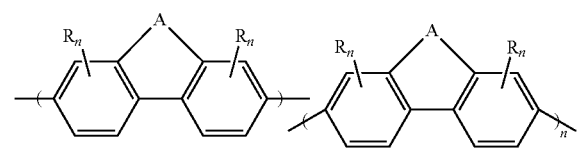

II

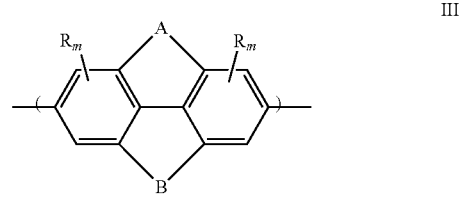

III

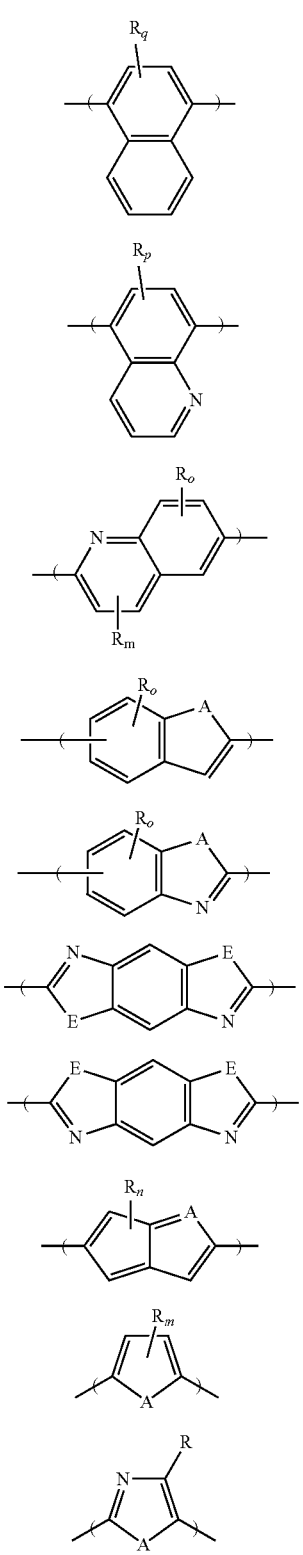

where R is independently selected from the group consisting of H, D, F, alkoxy, aryloxy, alkyl, aryl, alkyl ketone, aryl ketone, alkylester, arylester, amide, carboxylic acid, fluoroalkyl, fluoroaryl, polyalkylene oxy, Cl, Br, I, CN, $NO_2$, OH, and SH; m is 0-2; n is 0-3; o is 0-4; p is 0-5; q is 0-6; A and B are independently selected from the group consisting of —O—, —S—, —$NR_8$—, and —$CR_1R_2$—, —$CR_1R_2CR_3R_4$—, —N=$CR_1$—, —$CR_1$=$CR_2$—, —N=N—, and —(CO)—, where $R_1$-$R_4$ are selected from the group consisting of H, D, F, alkyl, aryl, alkyleneoxy, polyalkyleneoxy, alkoxy, aryloxy, fluoroalkyl, and fluoroaryl; $R_8$ is selected from the group consisting of H, D, alkyl, aryl, heteroaryl, fluoroalkyl, fluoroaryl, ketone, arylketone, arylester, alkylester, and carboxylic acid; E is selected from the group consisting of O, NH, and S; where any of the R groups may be polymeric and selected from the group consisting of linear, branched, hyperbranched, and dendrimeric; and where any two adjacent R groups taken together may be bridging within the repeat unit.

43. A light emitting composition comprising at least one polymer covalently coordinated to a luminescent or phosphorescent metal ion or metal ion complex, wherein the metal ion or metal ion complex of the composition emits light primarily from a triplet state, or a state of higher multiplicity, wherein the polymer has a conjugation length that is controlled with at least one non-aromatic spacer group.

44. The composition of claim 43, wherein the polymer has the conjugation length of between 2 and 50 conjugated rings.

45. The composition of claim 43, wherein the polymer has the conjugation length of between 3 and 10 conjugated rings.

46. The composition of claim 43, wherein the polymer has the conjugation length of between 3 and 6 conjugated rings.

47. A light emitting composition comprising at least one polymer covalently coordinated to a luminescent or phosphorescent metal ion or metal ion complex, wherein the metal ion or metal ion complex of the composition emits light primarily from a triplet state, or a state of higher multiplicity, wherein the polymer contains at least one spacer group selected from the group consisting of —O—, —S—, —$NR_8$—, —$CR_1R_2$—, —$(CH_2)_n$—, —$(CF_2)_n$—, -ester-, -amide-, and —Si—; where $R_1$-$R_2$ are selected from the group consisting of H, D, F, alkyl, aryl, alkyleneoxy, polyalkyleneoxy, alkoxy, aryloxy, fluoroalkyl, and fluoroaryl; n is 0-3; $R_8$ is selected from the group consisting of H, D, alkyl, aryl, heteroaryl, fluoroalkyl, fluoroaryl, ketone, arylketone, arylester, alkylester, and carboxylic acid; where any of the R groups may be polymeric and selected from the group consisting of linear, branched, hyperbranched, and dendrimeric; and where any two adjacent R groups taken together may be bridging.

48. A light emitting composition comprising at least one polymer covalently coordinated to a luminescent or phosphorescent metal ion or metal ion complex, wherein the excited state of the polymer is at a higher energy level than the excited state of the metal ion or metal ion complex such that upon excitation of the composition, the metal ion or metal ion complex removes excited state energy from the covalently coordinated polymer, and further wherein the metal ion or metal ion complex of the composition emits light primarily from a triplet state, or a state of higher multiplicity, wherein the polymer is a mixture of more than one phosphorescent polymer.

49. A light emitting composition comprising at least one polymer covalently coordinated to a luminescent or phosphorescent metal ion or metal ion complex, wherein the excited state of the polymer is at a higher energy level than the excited state of the metal ion or metal ion complex such that upon excitation of the composition, the metal ion or metal ion complex removes excited state energy from the covalently coordinated polymer, and further wherein the metal ion or metal ion complex of the composition emits light primarily from a triplet state, or a state of higher multiplicity, wherein the polymer is a mixture of at least one phosphorescent polymer and at least one fluorescent polymer.

50. An electroluminescent device comprising:
a first electrode and a second electrode; and
a polymer mixture disposed therebetween comprising
an electroluminescent layer comprising a light emitting composition comprising at least one polymer covalently coordinated to a luminescent or phosphorescent metal ion or metal ion complex, wherein the composition emits light primarily from a triplet state, or a state of higher multiplicity; and
at least one charge transport material.

51. The electroluminescent device of claim 50, wherein one or both of said electrodes is a transparent electrode.

52. The electroluminescent device of claim 50, wherein one or both of said electrodes comprises one of either tin oxide or doped tin oxide.

53. The electroluminescent device of claim 50, wherein one of the at least one charge transport materials is a hole transport material, and wherein the hole transport material is provided as a distinct layer.

54. The electroluminescent device of claim 50 comprising a first and second layer, wherein the first layer comprises a hole transport material, and wherein the second layer is the electroluminescent layer, which comprises an electron transport material.

55. The electroluminescent device of claim 50, further comprising an electron transport material, wherein the electron transport material is provided as a distinct layer.

56. The electroluminescent device of claim 50 comprising a first and second layer, wherein the first layer comprises an electron transport material, and wherein the second layer is the electroluminescent layer, which comprises a hole transport material.

57. The electroluminescent device of claim 50 comprising three layers, the electroluminescent layer, which is disposed between a first layer of an electron transport material and a second layer of a hole transport material.

58. The electroluminescent device of claim 57, wherein the layers are graded.

59. The electroluminescent device of claim 50 further comprising a hole transport material and an electron transport material, both of which are graded into the electroluminescent layer.

60. The electroluminescent device of claim 50, wherein the phosphorescent metal ion or metal ion complex has a phosphorescent lifetime of less than 10 microseconds.

61. The electroluminescent device of claim 50, wherein the phosphorescent metal ion or metal ion complex has a phosphorescent lifetime of less than 100 nanoseconds.

62. The electroluminescent device of claim 50, wherein the phosphorescent metal ion or metal ion complex has a phosphorescent lifetime of less than 10 nanoseconds.

63. The electroluminescent device of claim 50, wherein the phosphorescent metal ion or metal ion complex has a phosphorescent lifetime from about 10 to about 100 microseconds.

64. The electroluminescent device of claim 50, wherein the electroluminescent layer comprises a nanosized powder with physical dimensions in the 1 to 1000 nanometer range.

65. The electroluminescent device of claim 49, wherein the device has a primary emission color selected from the group consisting of red, green, blue, and white.

66. The electroluminescent device of claim 50, wherein the emission layer comprises mixtures of different color phosphors.

67. The electroluminescent device of claim 50, wherein the device has an emission color that is tunable.

68. The electroluminescent device of claim 50, wherein the device has an emission in the infrared region of the spectrum.

69. An electroluminescent device comprising a light emitting composition comprising at least one polymer covalently coordinated to a luminescent or phosphorescent metal ion or metal ion complex, wherein the composition emits light primarily from a triplet state, or a state of higher multiplicity, wherein the luminescent metal ion or metal ion complex is present as part of an inorganic solid.

70. The electroluminescent device of claim 69, wherein the inorganic solid is a semiconductor.

71. The electroluminescent device of claim 70, wherein the semiconductor is a type II-VI semiconductor.

72. An electroluminescent device comprising a light emitting composition comprising at least one polymer covalently coordinated to a luminescent or phosphorescent metal ion or metal ion complex, wherein the composition emits light primarily from a triplet state, or a state of higher multiplicity, wherein the device has a turn-on voltage of less than 15V.

73. The electroluminescent device of claim 72, wherein the device has a turn-on voltage of less than 10V.

74. The electroluminescent device of claim 72, wherein the device has a turn-on voltage of less than 5V.

75. A light emitting composition comprising a polymer mixture of at least one non-conjugated polymer covalently coordinated to at least one luminescent or phosphorescent metal ion or metal ion complex; and one or more at least partially conjugated charge carrying polymer that is at least one of a hole and electron transport material, wherein the excited state of at least the non-conjugated polymer is at a higher energy level than the excited state of the metal ion or metal ion complex such that upon excitation of the composition, the metal ion or metal ion complex removes excited state energy from the covalently coordinated polymer, and further wherein the metal ion or metal ion complex of the composition emits light primarily from a triplet state, or a state of higher multiplicity.

76. The composition of claim 75, wherein the charge carrying polymer is linear.

77. The composition of claim 75, wherein the charge carrying polymer is conjugated.

78. The composition of claim 75, wherein the charge carrying polymer is both a hole and electron transport material.

79. The composition of claim 75 wherein the at least one polymer is selected from the group of branched, hyperbranched and dendrimeric.

80. The composition of claim 75, wherein the at least one polymer comprises at least two polymers that emit at different wavelengths.

81. The composition of claim 75, wherein the composition is a mixture having a morphology selected from the group of a homogenous blend, a microphase separated blend, a phase separated blend, and a mixture thereof.

82. The composition of claim 75, wherein the polymer comprises repeat units selected from the group consisting of:

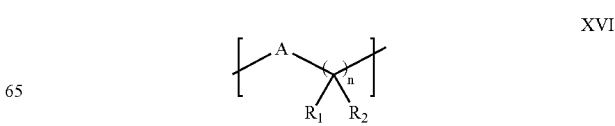

XVI

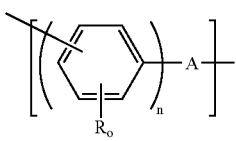

where R₀, R₁, and R₂ are independently selected from the group consisting of H, D, F, alkoxy, aryloxy, alkyl, aryl, alkyl ketone, aryl ketone, alkylester, arylester, amide, carbazole, arylamine, carboxylic acid, fluoroalkyl, fluoroaryl, polyalkyloxy, and polyaryloxy; o is 0-4; n is 1-11; A is independently selected from the group consisting of —O—, —S—, —NR₈—, —CR'₁R'₂—, —CR'₁R'₂CR'₃R'₄—, —N=CR'₁—, —CR'₁=CR'₂—, —N=N—, and —(CO)—, where R'₁-R'₄ are selected from the group consisting of H, D, F, alkyl, aryl, alkyleneoxy, polyalkyleneoxy, alkoxy, aryloxy, fluoroalkyl, and fluoroaryl, where R₈ is selected from the group consisting of H, D, alkyl, aryl, heteroaryl, fluoroalkyl, fluoroaryl, ketone, arylketone, arylester, alkylester, and carboxylic acid; where any of the R groups may be polymeric and selected from the group consisting of linear, branched, hyperbranched, and dendrimeric; and where any two adjacent R or R' groups taken together may be bridging.

83. The composition of claim 75, wherein the phosphorescent metal ion is selected from the group consisting of group VIII transition metals and gold.

84. The composition of claim 75, wherein the metal ion or ions at least include an element selected from the group consisting of platinum, iridium, osmium, and gold.

85. The composition of claim 75, wherein the composition contains at least one cyclometalating unit bound to a metal ion or metal ion complex.

86. The composition of claim 85, wherein the cyclometalating unit is selected from the group consisting of:

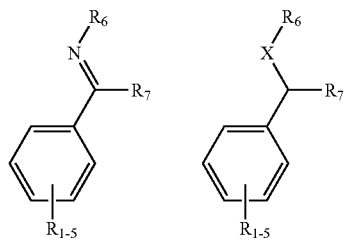

where X is selected from the group consisting of O, S, NH, and NR₈; R₁, R₂, R₃, R₄ or R₅ are selected from the group consisting of H, D, alkyl, aryl, F, CF₃, Cl, Br, I, CN, NO₂, amine, amide, alkoxy, aryloxy, alkylester, arylester, OH, SH, and carboxylic acid; R₇ is selected from the group consisting of H, alkyl or aryl; part of a bridged cyclic ring, a bridged heterocyclic ring, a bridged aromatic ring, a bridged aromatic heterocyclic ring, and a bridged non-aromatic heterocyclic ring; where R₆ and R₈ are selected from the group consisting of H, D, alkyl, aryl, heteroaryl, fluoroalkyl, fluoroaryl, ketone, arylketone, arylester, alkylester, and carboxylic acid; where any of the R groups may be polymeric and selected from the group consisting of linear, branched, hyperbranched, and dendrimeric; and where any two adjacent R groups taken together may be bridging.

87. The composition of claim 85, wherein the cyclometalating unit is one of either covalently attached to the polymer backbone or part of the polymer chain itself.

88. The composition of claim 75, wherein the composition contains at least one polarizable ligand bound to a metal ion or metal ion complex.

89. The composition of claim 88, wherein the polarizable ligand is selected from the group consisting of:

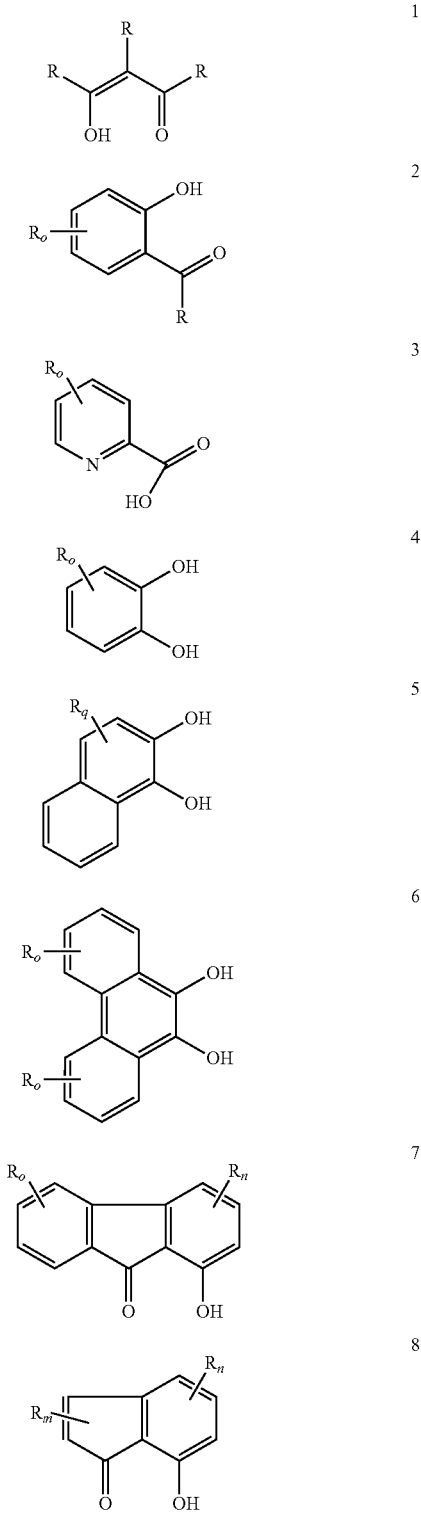

-continued

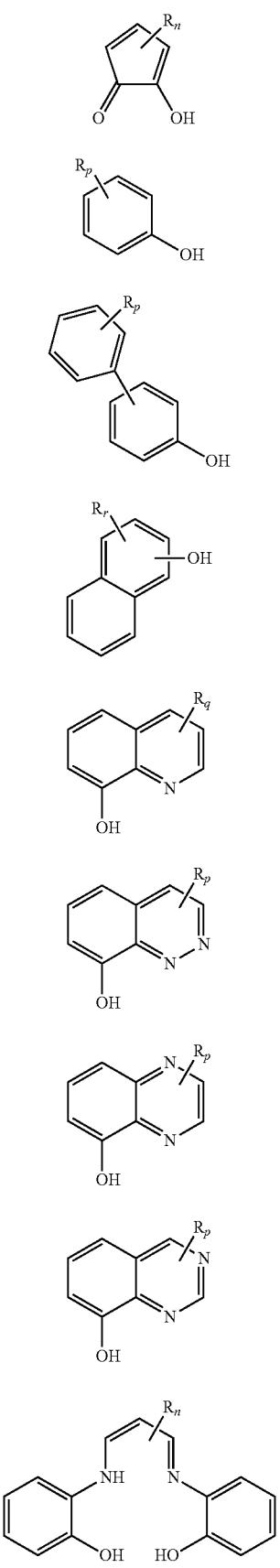

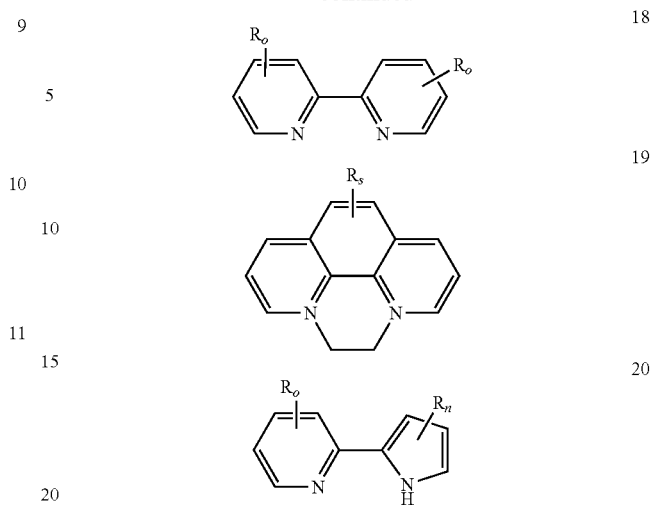

where R is independently selected from the group consisting of H, D, F, alkoxy, aryloxy, alkyl, aryl, alkyl ketone, aryl ketone, alkylester, arylester, amide, carboxylic acid, fluoroalkyl, fluoroaryl, polyalkalene oxy, Cl, Br, I, CN, $NO_2$, OH, and SH; m is 0-2; n is 0-3; o is 0-4; p is 0-5; q is 0-6; r is 0-7; s is 0-8; where any of the R groups may be polymeric and selected from the group consisting of linear, branched, hyperbranched, and dendrimeric; and where any two adjacent R groups taken together may be bridging.

90. The composition of claim 88, wherein the polarizable ligand is part of a polymer chain.

91. The composition of claim 75, wherein the composition contains at least one cyclometalating unit and one polarizable ligand bound to a metal ion or metal ion complex.

92. The composition of claim 75, wherein the composition comprises a crosslinked polymer.

93. The composition of claim 75, wherein the composition comprises an oligomer.

94. The composition of claim 75, wherein the composition comprises a branched polymer.

95. The composition of claim 75, wherein the composition comprises a hyperbranched polymer.

96. The composition of claim 75, wherein the composition comprises a dendritic polymer.

97. The composition of claim 75, wherein the composition comprises a block copolymer.

98. The composition of claim 75, wherein the composition comprises a random copolymer.

99. The composition of claim 75, wherein the composition comprises a graft copolymer.

100. The composition of claim 75, wherein the composition comprises a mixture of at least two polymers selected from the group consisting of crosslinked, oligomer, branched, hyperbranched, dendrimeric, block copolymer, random copolymer, and graft copolymer.

101. The composition of claim 100, wherein energy transfer between adjacent metal ion or metal ion complexes is prevented.

102. The composition of claim 75, wherein the composition comprises a mixture selected from the group consisting of at least two dendrimeric polymers, at least two hyperbranched polymers, and a mixture of at least one dendrimeric and at least one hyperbranched polymer.

103. The composition of claim 75, wherein the composition comprises a mixture of more than one phosphorescent polymer.

104. The composition of claim 75, wherein the composition comprises a mixture of at least one phosphorescent and one fluorescent polymer.

105. An electroluminescent device comprising the composition of claim 75.

106. An electroluminescent device comprising:
a first electrode and a second electrode; and
the polymer mixture of claim 74 disposed therebetween.

107. The electroluminescent device of claim 106, wherein at least one of said electrodes is a transparent electrode.

108. The electroluminescent device of claim 106, wherein at least one of said electrodes comprises one of either tin oxide or doped tin oxide.

109. The electroluminescent device of claim 106, wherein one of the at least one charge carrying polymer is a hole transport material, and further wherein the hole transport material is provided as a distinct layer.

110. The electroluminescent device of claim 106, further comprising a first and second layer, the first layer comprising a first charge carrying polymer wherein the first charge carrying polymer is a hole transport material, and the second layer comprising an electroluminescent layer which comprises the at least one polymer and a second charge carrying polymer wherein the second charge carrying polymer is an electron transport material.

111. The electroluminescent device of claim 106, wherein the charge carrying polymer is an electron transport material, and further wherein the electron transport layer is provided as a distinct layer.

112. The electroluminescent device of claim 106 comprising first and second layers, wherein the first layer comprises a first charge carrying polymer, wherein the first charge carrying polymer is an electron transport material, and wherein the second layer comprises an electroluminescent layer which comprises the at least one polymer and a second charge carrying polymer, wherein the second charge carrying polymer is a hole transport material.

113. The electroluminescent device of claim 106 comprising three layers, an electroluminescent layer comprising the at least one polymer, which is disposed between a layer of a first charge carrying polymer, which is an electron transport material, and a layer of a second charge carrying polymer, which is a hole transport material.

114. The electroluminescent device of claim 106, wherein the device comprises multiple layers and wherein the layers are graded.

115. The electroluminescent device of claim 106, comprising both a hole transport material and an electron transport material, both of which are graded into the electroluminescent layer.

116. The electroluminescent device of claim 106, wherein the phosphorescent material has a phosphorescent lifetime of less than 10 microseconds.

117. The electroluminescent device of claim 106, wherein the phosphorescent material has a phosphorescent lifetime from about 10 to about 100 microseconds.

118. The electroluminescent device of claim 106, wherein the phosphorescent metal ion or phosphorescent metal ion complex is present as part of an inorganic solid.

119. The electroluminescent device of claim 106, wherein the polymer mixture is disposed in an electroluminescent layer, which comprises a nanosized powder with physical dimensions in the 1 to 1000 nanometer range.

120. The electroluminescent device of claim 118, wherein the inorganic solid is a semiconductor.

121. The electroluminescent device of claim 120, wherein the semiconductor is a type II-VI semiconductor.

122. The electroluminescent device of claim 106, wherein the device has a turn-on voltage of less than 15V.

123. The electroluminescent device of claim 106, wherein the device has a turn-on voltage of less than 10V.

124. The electroluminescent device of claim 106, wherein the device has a turn-on voltage of less than 5V.

125. The electroluminescent device of claim 106, wherein the device has a primary emission color selected from the group consisting of red, green, blue, and white.

126. The electroluminescent device of claim 106, wherein the polymer mixture comprises a mixture of different color phosphors.

127. The electroluminescent device of claim 106, wherein the device has a primary emission color that is tunable.

128. The electroluminescent device of claim 106, wherein the device has a primary emission color in the infrared region of the spectrum.

* * * * *